(12) United States Patent
Matsumoto et al.

(10) Patent No.: US 11,043,485 B2
(45) Date of Patent: Jun. 22, 2021

(54) ELECTRONIC DEVICE HAVING SEMICONDUCTOR DEVICE WITH PROTECTIVE RESISTOR

(71) Applicant: HITACHI AUTOMOTIVE SYSTEMS, LTD., Hitachinaka (JP)

(72) Inventors: Masahiro Matsumoto, Tokyo (JP); Hiroshi Nakano, Tokyo (JP); Yoshimitsu Yanagawa, Tokyo (JP); Akira Kotabe, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 69 days.

(21) Appl. No.: 16/461,684

(22) PCT Filed: Dec. 20, 2017

(86) PCT No.: PCT/JP2017/045673
§ 371 (c)(1),
(2) Date: May 16, 2019

(87) PCT Pub. No.: WO2018/135220
PCT Pub. Date: Jul. 26, 2018

(65) Prior Publication Data
US 2019/0355714 A1    Nov. 21, 2019

(30) Foreign Application Priority Data
Jan. 19, 2017    (JP) .............................. JP2017-007160

(51) Int. Cl.
*H01L 27/02* (2006.01)
*H01L 23/64* (2006.01)
(Continued)

(52) U.S. Cl.
CPC ............................. *H01L 27/0248* (2013.01)
(Continued)

(58) Field of Classification Search
CPC ...... H03K 17/08; H02H 9/044; H01L 23/647; H01L 27/0248; H01L 27/0266; H01L 27/0288
See application file for complete search history.

(56) References Cited

U.S. PATENT DOCUMENTS 5,248,892 A    9/1993  Van Roozendaal
2002/0033507 A1*  3/2002  Maria Verhaege .........................
                                                   H01L 27/0266
                                                   257/360

(Continued)

FOREIGN PATENT DOCUMENTS

JP    59-16364 A    1/1984
JP    60-42856 A    3/1985
(Continued)

OTHER PUBLICATIONS

International Search Report with English translation and Written Opinion issued in corresponding application No. PCT/JP2017/045673 dated Mar. 20, 2018.

*Primary Examiner* — Thienvu V Tran
*Assistant Examiner* — Sisay G Tiku
(74) *Attorney, Agent, or Firm* — Foley & Lardner LLP

(57) ABSTRACT

In a protective circuit of a conventional electronic device, surge resistance is low and it is difficult to connect an external connection terminal of an integrated circuit directly to an external connection terminal of the electronic device or the like. A protective circuit of an electronic device according to the present embodiment includes an external connection terminal 1 which is connected to an external signal; a wiring layer 2 which connects the external connection terminal 1 and a protective resistor 3; a protective resistor 3 which protects an internal circuit from surges or noises input from the external connection terminal 1; slits which divide the protective resistor 3; current distribution resistors which (Continued)

are constituted by dividing the protective resistor 3 by the slits; and MOS transistors which are connected to the current distribution resistors.

12 Claims, 21 Drawing Sheets

(51) Int. Cl.
*H02H 9/04* (2006.01)
*H03K 17/08* (2006.01)

(56) References Cited

U.S. PATENT DOCUMENTS

| | | | | |
|---|---|---|---|---|
| 2003/0227053 A1* | 12/2003 | Nomura | ............... | H01L 27/0277 257/344 |
| 2005/0122646 A1* | 6/2005 | Okushima | ........... | H01L 27/0288 361/56 |
| 2009/0310265 A1 | 12/2009 | Fukuoka | | |
| 2020/0051716 A1* | 2/2020 | Kinoshita | ............. | H01C 7/001 |
| 2020/0098939 A1* | 3/2020 | Nakai | ............... | H01L 31/02363 |
| 2020/0121166 A1* | 4/2020 | Thissen | ................ | A61B 1/0055 |
| 2020/0266207 A1* | 8/2020 | Liu | ..................... | H01L 23/5226 |

FOREIGN PATENT DOCUMENTS

| | | |
|---|---|---|
| JP | 60-136359 A | 7/1985 |
| JP | 2-17669 A | 1/1990 |
| JP | 1990-15746 U | 1/1990 |
| JP | 2-273971 A | 11/1990 |
| JP | 11-312783 A | 11/1999 |
| JP | 2005-167049 A | 6/2005 |
| JP | 2005-303051 A | 10/2005 |
| JP | 2010-28109 A | 2/2010 |
| JP | 2011-96897 A | 5/2011 |

* cited by examiner

LENGTHS OF SLITS 4, 5, 6, 7, 8, 9, AND 10

LENGTHS OF SLITS 4, 5, 6, 7, 8, 9, AND 10

LENGTHS OF SLITS 4, 5, 6, 7, 8, 9, AND 10

ELECTRONIC DEVICE HAVING SEMICONDUCTOR DEVICE WITH PROTECTIVE RESISTOR

TECHNICAL FIELD

The present invention relates to an electronic device having a surge protective circuit constituted by connecting a protective resistor and a plurality of semiconductor elements in parallel, particularly, an electronic device having an optimum surge protective circuit in a fine integrated circuit.

BACKGROUND ART

As an example of an electronic device having a surge protective circuit constituted by connecting a protective resistor and a plurality of semiconductor elements in parallel, there is technology described in PTL 1. PTL 1 discloses that current concentration is reduced by disposing protective resistors in all of a plurality of MOS transistors connected to an external connection terminal. Further, the protective resistor is disposed in the vicinity of the MOS transistor and the external connection terminal and the protective resistor are connected by using a Yagi antenna-like wiring line from the external connection terminal.

CITATION LIST

Patent Literature

PTL 1: JP 2011-96897 A

SUMMARY OF INVENTION

Technical Problem

In a small electronic device such as a sensor, an external connection terminal of an integrated circuit is connected directly to an external connection terminal of the electronic device. In this case, the external connection terminal of the integrated circuit needs to have surge resistance required for the external connection terminal of the electronic device. Further, the surge resistance of the external connection terminal of the electronic device is higher than the surge resistance required for the integrated circuit. Particularly, an electronic device for an automobile requires energy resistance that is at least 100 times the surge resistance required for the integrated circuit. As a result, the magnitude of a current flowing to the integrated circuit at the time of surge application and application time thereof are at least 10 times the surge resistance required for the conventional integrated circuit.

When such large surge resistance is obtained, the size of the protective resistor increases and the size and number of MOS transistors also increase. When the sizes of the protective resistor and the MOS transistor increase, layout efficiency is low and a chip size increases, in the layout where the protective resistor is disposed in the vicinity of the MOS transistor. Further, for a place where damage occurs due to current concentration of the current generated by the surge application, not only the MOS transistor but also the wiring line needs to be considered. In the case where protection of the wiring line is also considered, if the external connection terminal is connected to the protective resistor by using the Yagi antenna-like wiring line, a wiring line length is long and the wiring line becomes thin. For this reason, it is difficult to increase a current capacity of the wiring line. Further, if it is desired to increase the current capacity of the wiring line, the wiring line becomes thick and the chip size increases. PTL 1 lacks consideration for these matters.

The present invention has been made in view of the above circumstances and an object thereof is to provide an electronic device capable of increasing surge resistance of an external connection terminal of an integrated circuit without increasing a size and connecting the external connection terminal of the integrated circuit directly to an external connection terminal of the electronic device.

Solution to Problem

In order to solve the above problems, in the present invention, an external connection terminal is connected to a protective resistor, the protective resistor is connected to a semiconductor device having a plurality of semiconductor elements connected in parallel, and a slit or a continuous hole is disposed in the protective resistor.

Advantageous Effects of Invention

According to the present invention, it is possible to provide an electronic device that has a small size and high surge resistance.

DESCRIPTION OF EMBODIMENTS

Hereinafter, embodiments of the present invention will be described with reference to the drawings. The embodiments can be combined as long as no contradiction occurs.

First Embodiment

First, an electronic device to be a first embodiment of the present invention will be described using FIGS. 1 to 11.

Figure 1:
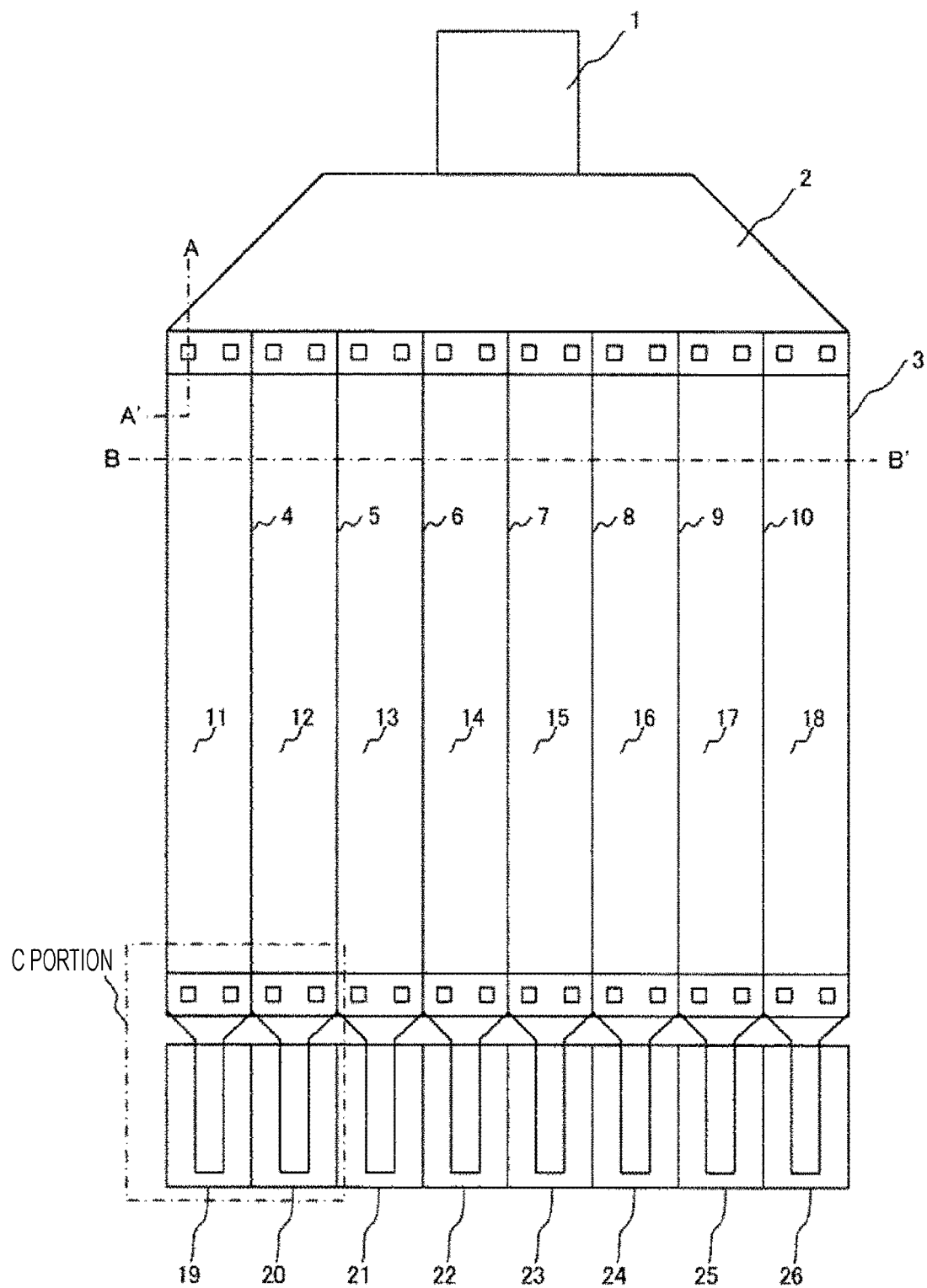
FIG. 1 shows a configuration of a protective circuit of an electronic device according to a first embodiment.

As shown in FIG. 1, a protective circuit of the electronic device according to the present embodiment includes a semiconductor device. The semiconductor device includes an external connection terminal 1 that is connected to an external signal, a wiring layer 2 that connects the external connection terminal 1 and a protective resistor 3, the protective resistor 3 that protects an internal circuit from surges and noises input from the external connection terminal 1, slits 4 to 10 that divide the protective resistor 3, current distribution resistors 11 to 18 that are constituted by dividing the protective resistor 3 by the slits 4 to 10, and MOS transistors 19 to 26 that are connected to the current distribution resistors 11 to 18. The MOS transistors 19 to are a plurality of semiconductor elements that are connected in parallel. The semiconductor device is used to control a sensor or an actuator inside or outside a semiconductor apparatus.

Figure 2:
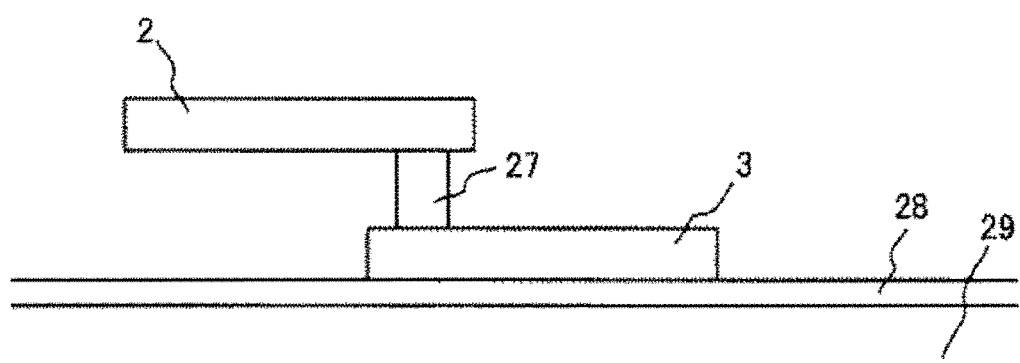
FIG. 2 shows a cross-section taken along A-A' of FIG. 1.

As shown in FIG. 2, the protective resistor 3 is connected to the wiring layer 2 via a contact 27. The protective resistor 3 is provided on an oxide film 28 provided on a silicon substrate 29. The protective resistor 3 is insulated from the silicon substrate 29 by the oxide film 28 to be an insulating film. In this way, insulation is secured against surges of a positive potential and a negative potential applied to the external connection terminal 1. As the protective resistor 3, a polysilicon film, a metal film, a metal silicide film, or the like can be used. Further, the present invention is not limited to the contact 27 and a through-hole or the like may be used.

Figure 3:
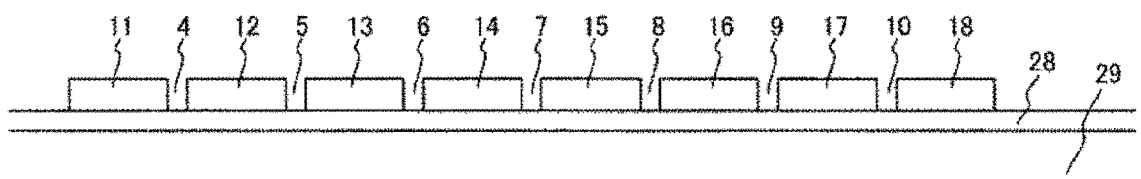
FIG. 3 shows a cross-section taken along B-B' of FIG. 1.

As shown in FIG. 3, the protective resistor 3 is divided by the slits 4 to 10 and constitutes the current distribution resistors 11 to 18.

Figure 4:
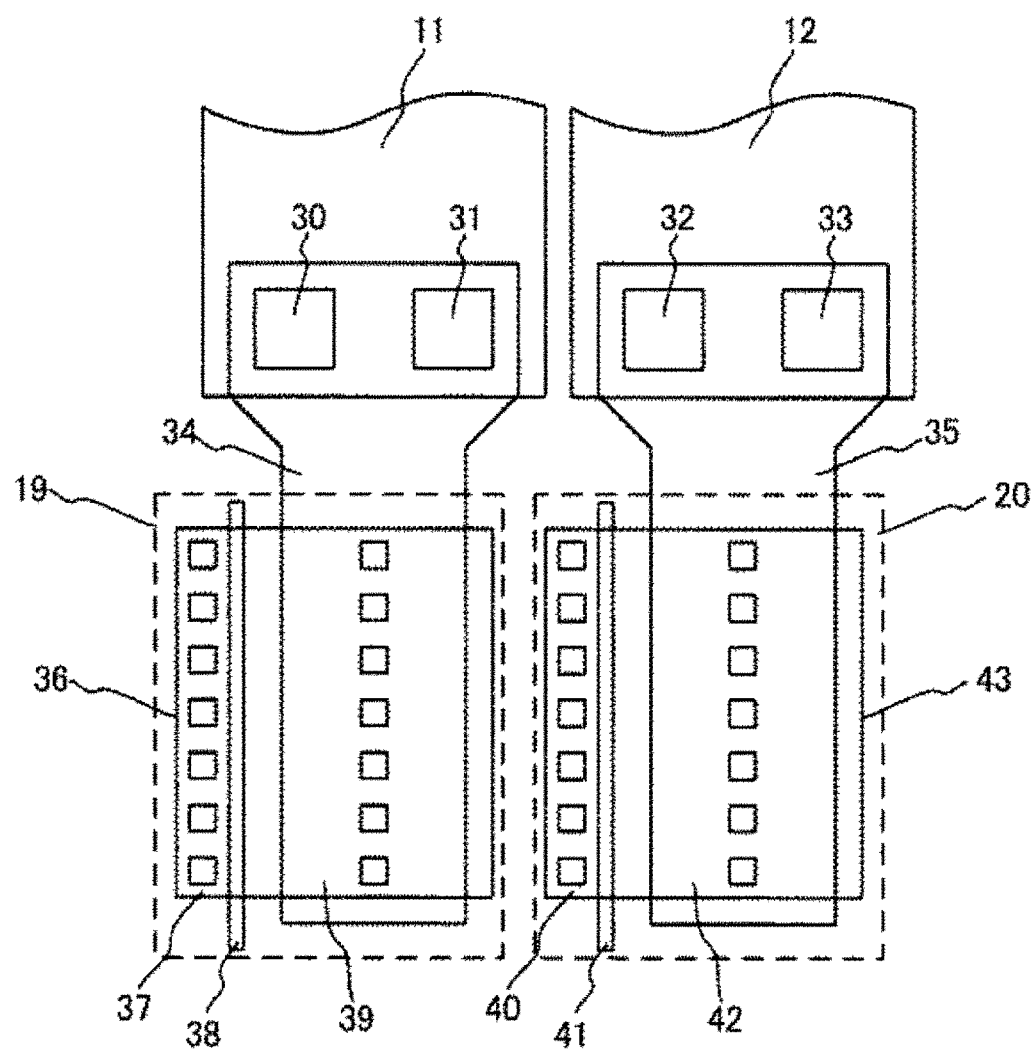
FIG. 4 is an enlarged view of a C portion of FIG. 1.

The details of the MOS transistors 19 and 20 will be described using FIG. 4. Also, the MOS transistors 21 to 26 have the same configuration as the MOS transistors 19 and 20. The MOS transistor 19 constitutes a source 37 and a drain 39 by a gate electrode 38 disposed in a diffusion layer 36. The source 37 is connected to a ground. The drain 39 is connected to the current distribution resistor 11 via a wiring layer 34 and contacts 30 and 31. The MOS transistor 20 constitutes a source 40 and a drain 42 by a gate electrode 41 disposed in a diffusion layer 43. The source 40 is connected to a ground. The drain 42 is connected to the current distribution resistor 12 via a wiring layer 35 and contacts 32 and 33.

Figure 5:
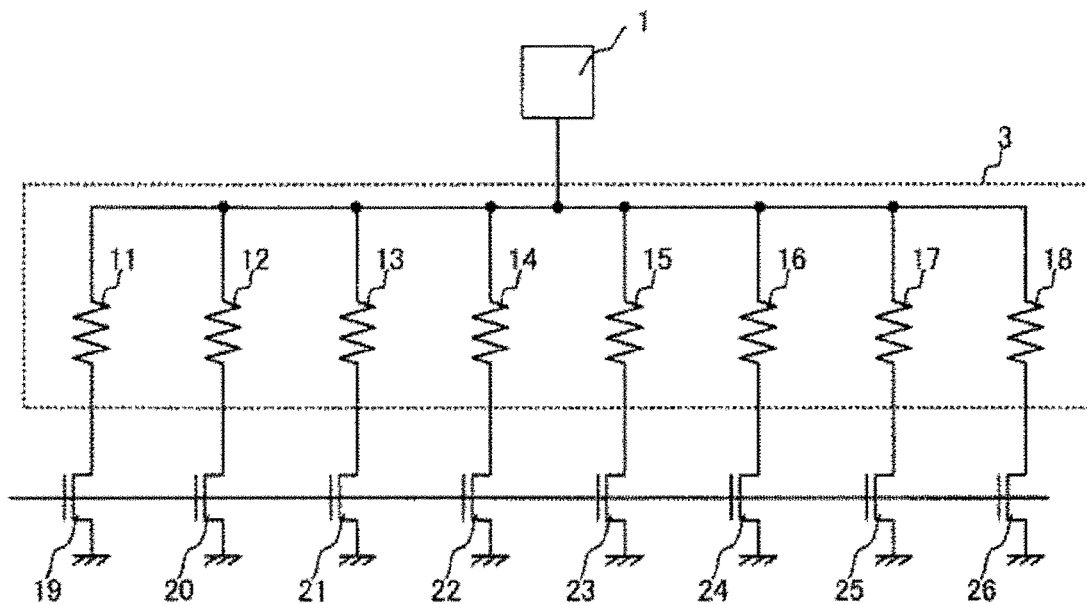
FIG. 5 is a circuit diagram of a protective circuit of an electronic device according to a first embodiment.

By constituting the protective circuit as shown in FIGS. 1, 2, 3, and 4, a circuit diagram of the protective circuit according to the present embodiment is displayed as shown in FIG. 5. That is, a current (voltage) input from the external connection terminal 1 is connected to the current distribution resistors 11 to 18 constituted by dividing the protective resistor 3. The current distribution resistors 11, 12, 13, 14, 15, 16, 17, and 18 are connected to the MOS transistors 19, 20, 21, 22, 23, 24, 25, and 26, respectively. The MOS transistors 19 to 26 drive the external connection terminal 1 by applying a signal to the gate electrode.

Next, a first effect of the present embodiment will be described.

Figure 6:
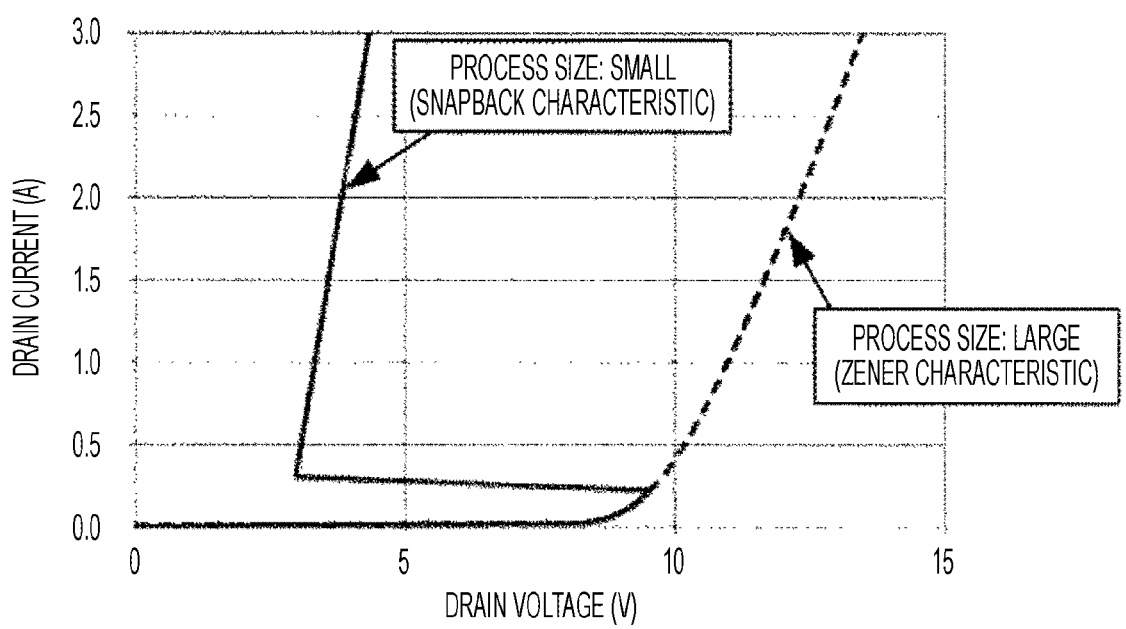
FIG. 6 shows voltage-current characteristics of MOS transistors 19, 20, 21, 22, 23, 24, 25, and 26.

As shown in FIG. 6, the MOS transistors 19 to 26 show breakdown characteristics in which a drain current sharply increases when a drain voltage is increased. Here, when process sizes of the MOS transistors 19 to 26 are large, zener characteristics are obtained as shown by a dotted line of FIG. 6. On the other hand, when the process sizes of the MOS transistors 19 to 26 are small (fine process), snapback characteristics are obtained as shown by a solid line of FIG. 6. Here, there is a problem that the snapback characteristic has a large variation for each MOS transistor.

Figure 7:
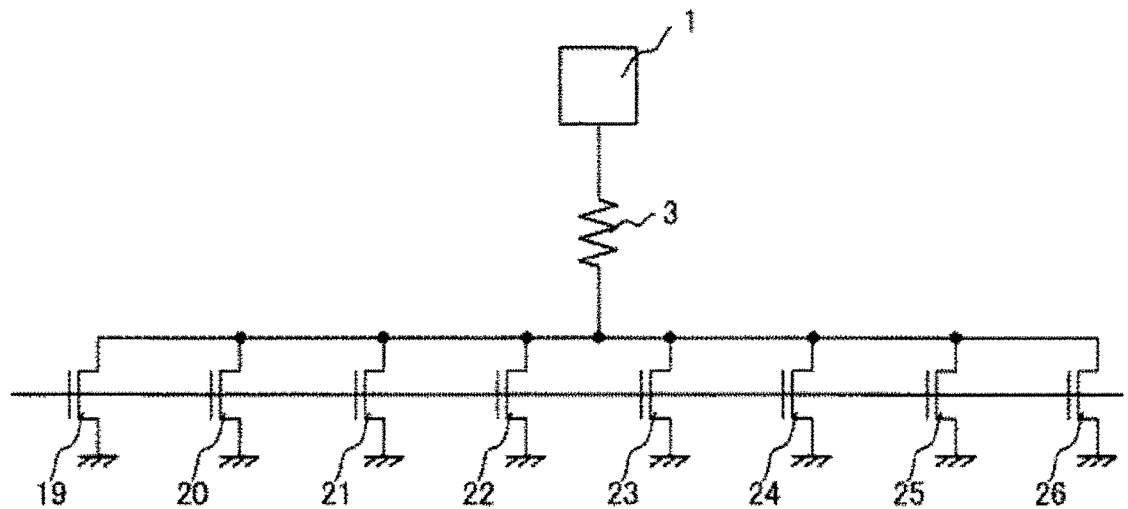
FIG. 7 is a circuit diagram of a protective circuit of an electronic device when a protective resistor 3 is not provided with a slit.

Here, FIG. 7 shows a protective circuit of an electronic device in the case of a conventional structure in which the protective resistor 3 is not provided with a slit. The case where a surge voltage is applied to the external connection terminal 1 in the conventional structure is considered. When the surge is applied to the external connection terminal 1, drain voltages of the MOS transistors 19 to 26 increase, and the MOS transistor which is most likely to snap back snaps back first. As a result, since the drain voltages of the MOS transistors 19 to 26 decrease, the MOS transistor that has snapped back first enters a snapback state, and the other MOS transistors do not snap back. As a result, a current concentrates on the MOS transistor that has snapped back first, and a connection wiring line of the MOS transistor that has snapped back first is damaged.

This phenomenon appears notably when a rising speed of the surge voltage applied to the external connection terminal 1 is slow. This is because it takes time for the MOS transistor to snap back, even though the drain voltage of the MOS transistor reaches a snapback voltage. That is, when the rising speed of the surge voltage is fast and rising time of the surge voltage is shorter than time until the MOS transistor actually snaps back, the voltage increases until the drain voltage of the certain MOS transistor reaches the snapback voltage and then the other MOS transistors snap back. That is, during delay time until the drain voltage of the certain MOS transistor snaps back, the other MOS transistors also snap back. However, in the case where the rising speed of the surge voltage is slow, if any one of the MOS transistors snaps back first, the drain voltages of the other MOS transistors do not increase to the snapback voltage, so that the current concentrates on the MOS transistor that has snapped back first.

When the external connection terminal of the integrated circuit is directly connected to the external connection terminal of the electronic device or the like, the rising speed of the surge voltage applied to the external connection terminal 1 becomes slow due to reactance by the wiring line, a capacitor added to the external connection terminal, a capacitor intentionally added, or the like. That is, when the external connection terminal of the integrated circuit is connected directly to the external connection terminal of the electronic device or the like, it is necessary to consider that the rising speed of the surge voltage becomes slow and the resistance of the protective circuit becomes small.

Next, the case where the surge is applied to the external connection terminal 1 of the protective circuit according to the present embodiment is considered. In the protective circuit of the present embodiment, if the surge is applied to the external connection terminal 1, the drain voltages of the MOS transistors 19 to 26 increase, and the MOS transistor which is most likely to snap back snaps back first. However, the drain current of the MOS transistor that has snapped back first is limited by the current distribution resistors 11 to 18. Therefore, the connection wiring line of the MOS transistor that has snapped back first can be prevented from being damaged.

Even in a state in which the MOS transistor having snapped back first snaps back, according to an increase in the current flowing to the MOS transistor having snapped back first, the current also flows to the current distribution resistor connected to the MOS transistor having snapped back first and the voltage of the external connection terminal 1 is increased by the product of the current distribution resistor and the current flowing thereto. As a result, the drain voltages of the other MOS transistors also increase and the other MOS transistors sequentially snap back. By the above operation, surge energy of the surge applied to the external connection terminal 1 is uniformly consumed by the current distribution resistors 11 to 18 and the MOS transistors 19 to 26. As a result, since losses in the current distribution resistors 11 to 18 and the MOS transistors 19 to 26 can be reduced, miniaturization of the protective circuit can be realized.

Further, the current flowing to the MOS transistors 19 to 26 are limited by the current distribution resistors 11 to 18, so that the connection wiring line to the MOS transistors 19 to 26 can be prevented from being damaged.

That is, by inserting the current distribution resistors, the current concentration due to the snapback is suppressed even when the rising of the surge voltage is slow, and the current flows uniformly to the MOS transistors 19 to 26.

Next, a second effect of the present embodiment will be described.

In the protective circuit according to the present embodiment, the slits 4 to 10 are provided in the protective resistor 3 to constitute the current distribution resistors 11 to 18. According to the present configuration, the external connection terminal 1, the protective resistor 3, and the MOS transistors 19 to 26 are connected at the shortest distance. In addition, the wiring layers 2, 34, and 35 connecting them can be shortened and the wiring widths thereof can be increased. As a result, the current capacity of the wiring layers 2, 34, and 35 can be increased and wiring damage due to the surge voltage applied to the external connection terminal 1 can be reduced. Further, the layout pitches of the slits 4 to 10 and the MOS transistors 19 to 26 can be easily matched. From the above, connectivity between the current distribution resistors 11 to 18 and the MOS transistors 19 to 26 can be improved and reduction of the chip size and improvement of the current capacity of the wiring layers 34 and 35 can be realized.

Next, a third effect of the present embodiment will be described.

Figure 8:
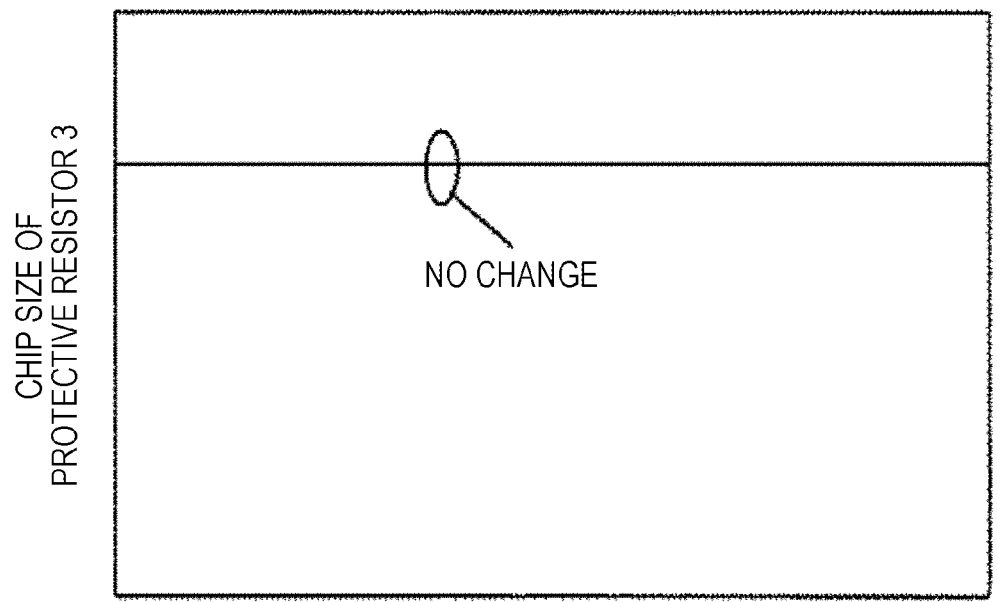
FIG. 8 shows a relation between lengths of slits 4, 5, 6, 7, 8, 9, and 10 and a chip size of a protective resistor 3.

FIG. 8 shows a relation between lengths of the slits 4 to 10 and a size of the protective resistor 3. Even if the slits 4 to 10 are lengthened, the chip size of the protective resistor 3 does not change.

Figure 9:
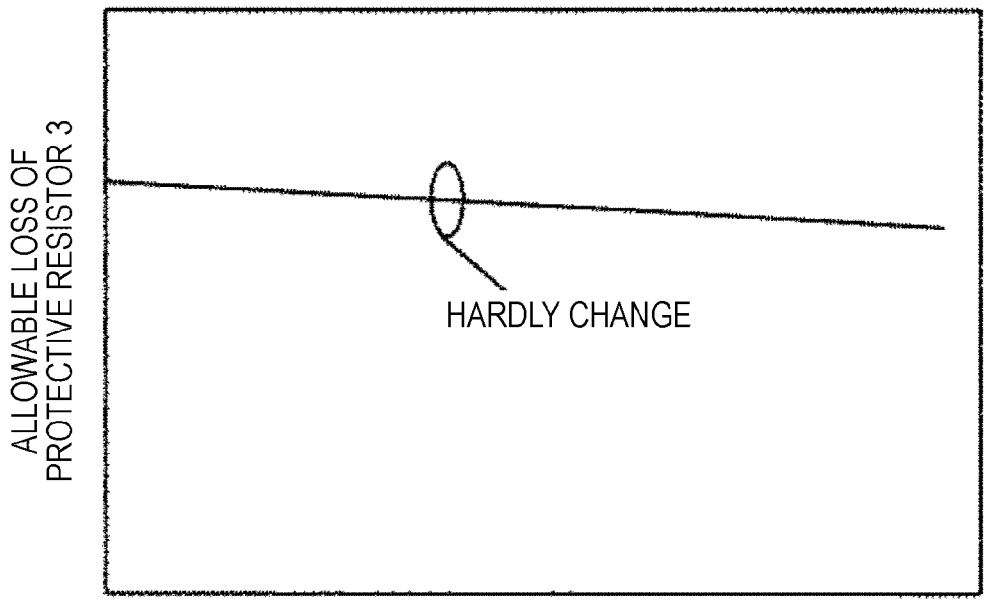
FIG. 9 shows a relation between lengths of slits 4, 5, 6, 7, 8, 9, and 10 and an allowable loss of a protective resistor 3.

FIG. 9 shows a relation between lengths of the slits 4 to 10 and an allowable loss of the protective resistor 3. The allowable loss of the protective resistor 3 is determined by a plane area of the protective resistor 3. The plane area of the protective resistor 3 is reduced by an amount corresponding to the slits 4 to 10. However, since the amount is minute, the allowable loss of the protective resistor 3 hardly changes even if the slits 4 to 10 are lengthened.

Figure 10:
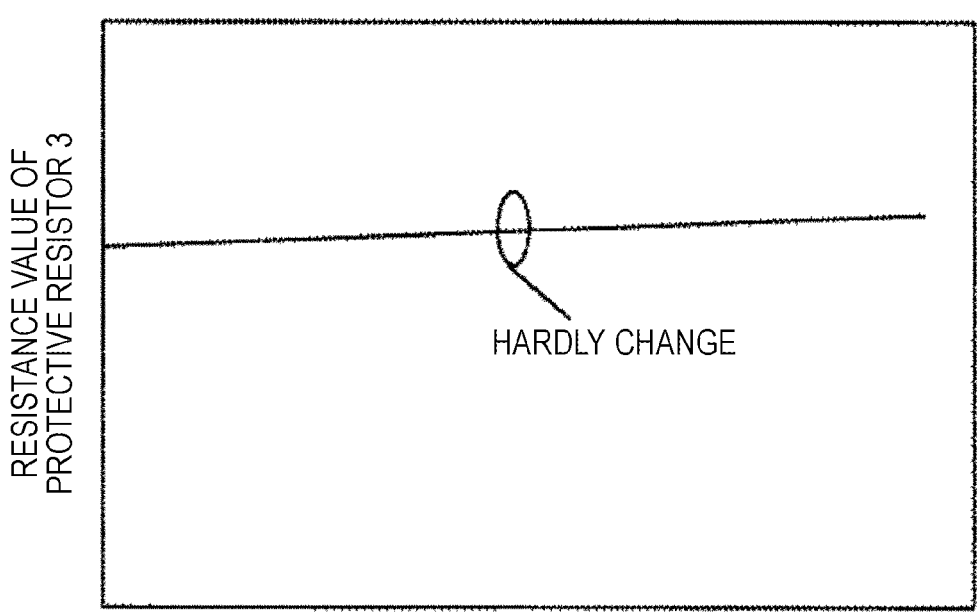
FIG. 10 shows a relation between lengths of slits 4, 5, 6, 7, 8, 9, and 10 and a resistance value of a protective resistor 3.

FIG. 10 shows a relation between lengths of the slits 4 to 10 and a resistance value of the protective resistor 3. The resistance value of the protective resistor 3 is determined by the resistivity, the width, and the length of the protective resistor 3. The width of the protective resistor 3 is reduced by an amount corresponding to the slits 4 to 10. However, since the amount is minute, the resistance value of the protective resistor 3 hardly changes.

Figure 11:
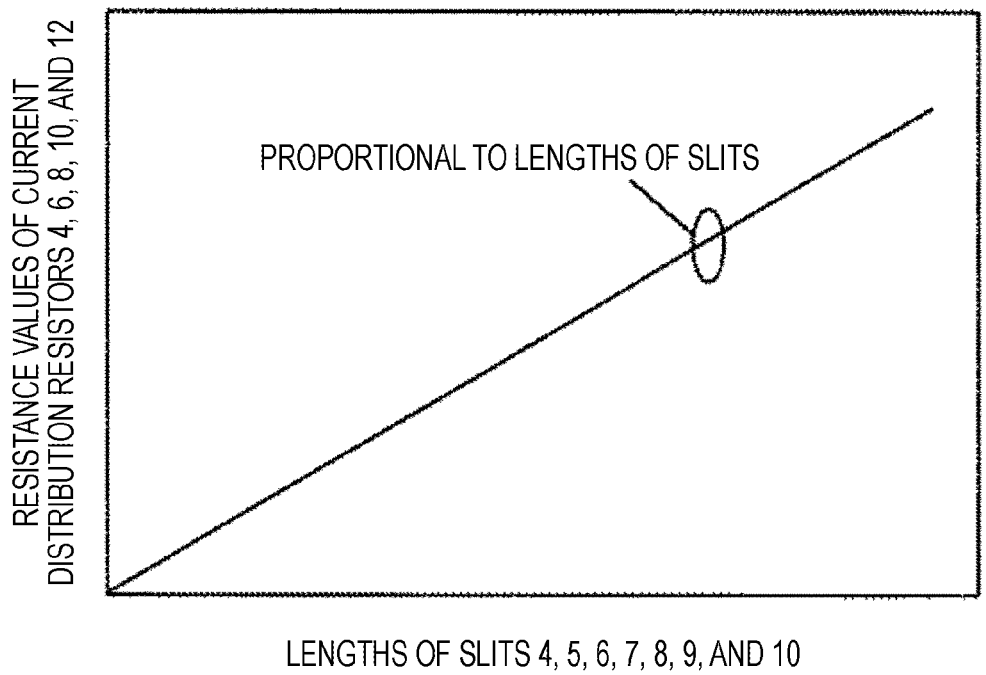
FIG. 11 shows a relation between lengths of slits 4, 5, 6, 7, 8, 9, and 10 and resistance values of current distribution resistors 11, 12, 13, 14, 15, 16, 17, and 18.

FIG. 11 shows a relation between lengths of the slits 4 to 10 and resistance values of the current distribution resistors 11 to 18. By lengthening the slits 4 to 10, the resistance values of the current distribution resistors 11 to 18 increase in proportion to the lengths. That is, by lengthening the slits 4 to 10, the current distribution resistors 11 to 18 having high resistance values can be realized without changing design values such as the size, the allowable loss, and the resistance value of the protective resistor 3. That is, by lengthening the slits 4 to 10, the resistance values of the current distribution resistors 11 to 18 can be easily increased. By increasing the resistance values of the current distribution resistors 11 to 18, the current flowing to the current distribution resistors 11 to 18 and the MOS transistors 19 to 26 can be limited. As a result, the connection wiring line to the MOS transistors 19 to 26 can be prevented from being damaged. The present effect is more preferable because the effect for the area of the protective resistor 3 can be maximized by disposing the slits 4 to 10 in a current energization direction, but the present invention is not limited to this. When the slits 4 to 10 are extended in an oblique direction, the slits contact a side end of the protective resistor 3 and the slit length is restricted with respect to the current energization direction. In other words, even when the slits 4 to 10 are extended in the oblique direction, the effect is reduced, but the effect is shown.

Next, a fourth effect of the present embodiment will be described.

In the protective circuit according to the present embodiment, variations of the resistance value from the external connection terminal 1 to the ground via the current distribution resistor 11 and the MOS transistor 19, the resistance value from the external connection terminal 1 to the ground via the current distribution resistor 12 and the MOS transistor 20, the resistance value from the external connection terminal 1 to the ground via the current distribution resistor 13 and the MOS transistor 21, the resistance value from the external connection terminal 1 to the ground via the current distribution resistor 14 and the MOS transistor 22, the resistance value from the external connection terminal 1 to the ground via the current distribution resistor 15 and the MOS transistor 23, the resistance value from the external connection terminal 1 to the ground via the current distribution resistor 16 and the MOS transistor 24, the resistance value from the external connection terminal 1 to the ground via the current distribution resistor 17 and the MOS transistor 25, and the resistance value from the external connection terminal 1 to the ground via the current distribution resistor 18 and the MOS transistor 26 can be decreased. When the slits are provided, the resistance values from the external connection terminal 1 to the MOS transistors 19 to 26 are determined by the resistance values of the current distribution resistors 11 to 18. However, when there is no slit, a path where the resistance value from the MOS transistor 19 provided in an end to the external connection terminal 1 is minimized and a path where the resistance value from the MOS transistor 22 disposed in a center portion to the external connection terminal 1 is minimized are different from each other and a difference between the paths becomes the variation of the resistance value. Therefore, in the present embodiment, as compared with the case where there is no slit, the variations of the resistance values from the external connection terminal 1 to the ground via the current distribution resistors and the MOS transistors can be reduced. As a result, the current flowing through the protective resistor 3 can be uniformized, the current concentration of the current flowing through the protective resistor 3 can be reduced, the allowable loss of the protective resistor 3 can be increased, and the chip size can be reduced.

Second Embodiment

Figure 12:
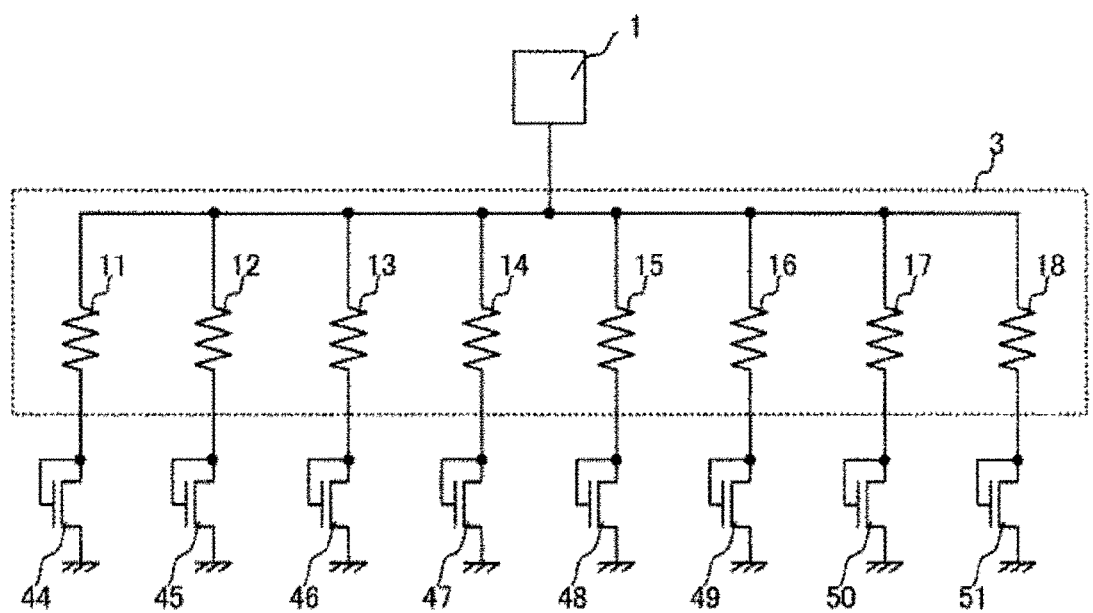
FIG. 12 is a circuit diagram of a protective circuit of an electronic device according to a second embodiment.

Next, an electronic device to be a second embodiment of the present invention will be described using FIG. 12. Description of the same configuration as that of the first embodiment will be omitted.

A protective circuit of the electronic device according to the present embodiment is basically the same as that of the electronic device according to the first embodiment. However, MOS transistors 19 to 26 are diode-connected to dispose MOS diodes 44 to 51. Even in this case, the same effects as those of the electronic device according to the first embodiment can be obtained. Further, in the present embodiment, an external connection terminal 1 can be used as an input terminal.

Third Embodiment

Figure 13:
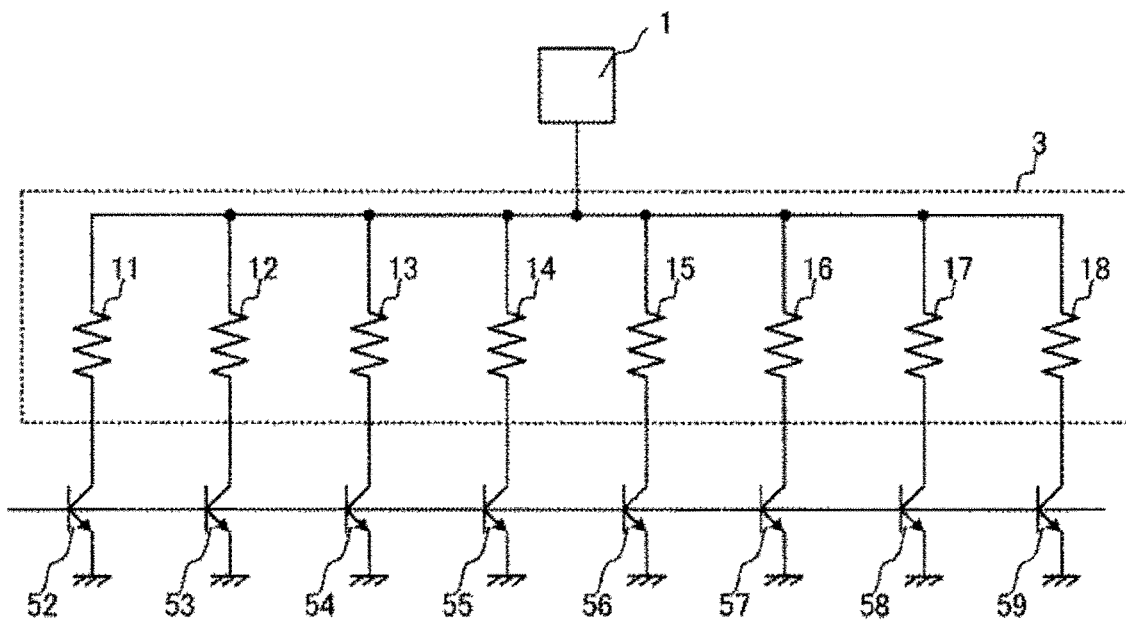
FIG. 13 is a circuit diagram of a protective circuit of an electronic device according to a third embodiment.

Next, an electronic device to be a third embodiment of the present invention will be described using FIG. 13. Description of the same configuration as that of the first embodiment will be omitted.

A protective circuit of the electronic device according to the present embodiment is basically the same as that of the electronic device according to the first embodiment. However, MOS transistors 19 to 26 are replaced by bipolar transistors 52 to 59. Even in this case, the same effects as those of the electronic device according to the first embodiment can be obtained. Further, by disposing the bipolar transistors 52 to 59, variations of the transistors can be reduced, a surge current is likely to flow uniformly to each transistor, and a chip size can be reduced.

Fourth Embodiment

Figure 14:
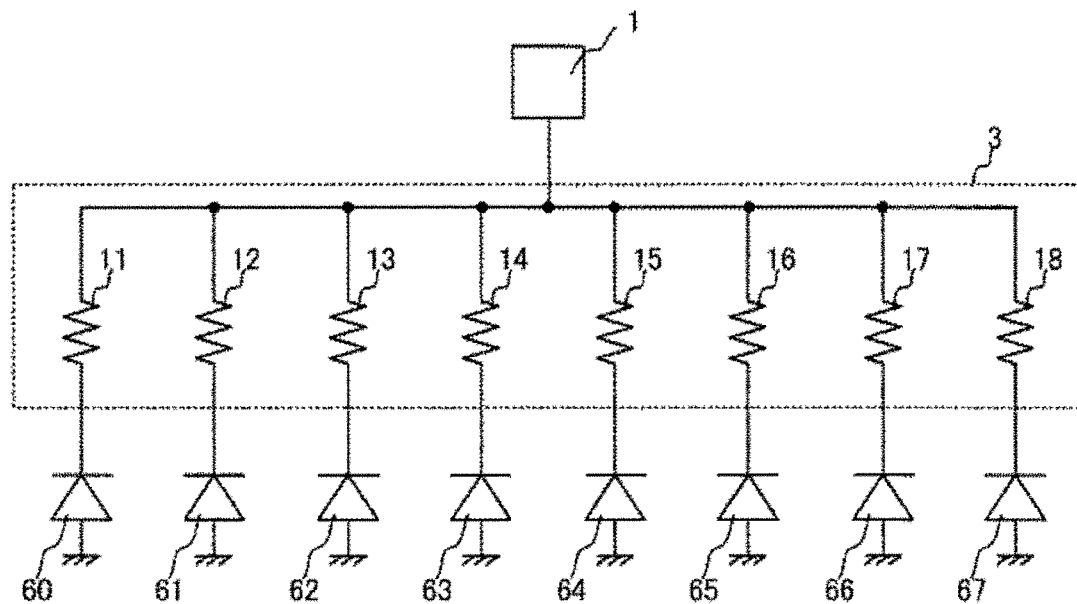
FIG. 14 is a circuit diagram of a protective circuit of an electronic device according to a fourth embodiment.

Next, an electronic device to be a fourth embodiment of the present invention will be described using FIG. 14. Description of the same configuration as that of the first embodiment will be omitted.

A protective circuit of the electronic device according to the present embodiment is basically the same as that of the electronic device according to the first embodiment. However, MOS transistors 19 to 26 are replaced by diodes 60 to 67. Even in this case, the same effects as those of the electronic device according to the first embodiment can be obtained.

Fifth Embodiment

Figure 15:
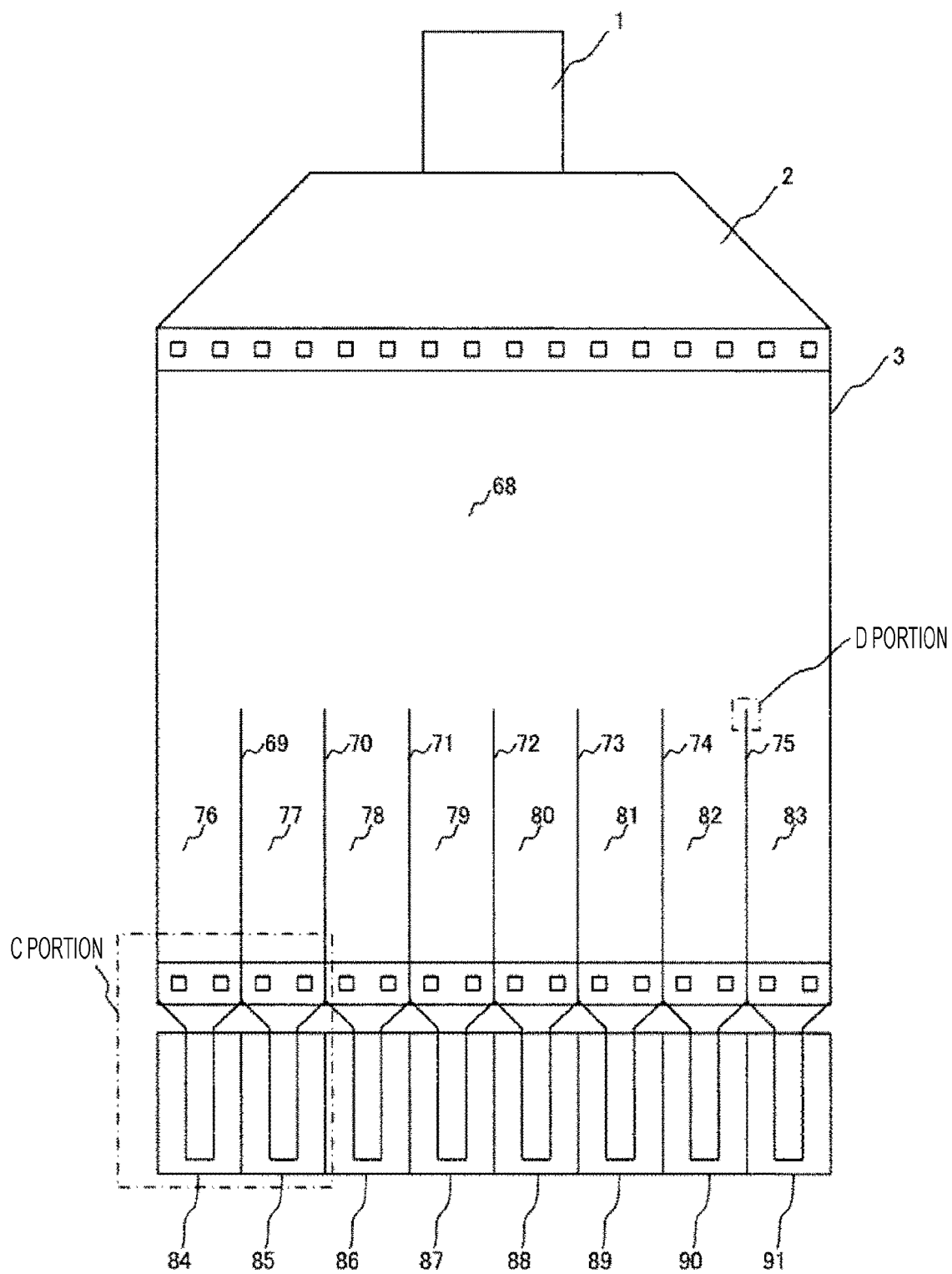
FIG. 15 shows a configuration of a protective circuit of an electronic device according to a fifth embodiment.

Next, an electronic device to be a fifth embodiment of the present invention will be described using FIGS. 15, 16, and 18. Description of the same configuration as that of the first embodiment will be omitted.

A protective circuit of the electronic device according to the present embodiment is basically the same as that of the first embodiment. However, the following changes are made. First, slits disposed in a protective resistor 3 are shortened. In the present embodiment, the protective resistor 3 is provided with slits 69 to 75 shorter than the protective resistor 3. In this way, a resistor 68 and current distribution resistors 76 to 83 are constituted in the protective resistor 3.

Next, a circuit diagram of the protective circuit according to the present embodiment will be described using FIG. 18. An external connection terminal 1 is connected to the resistor 68 constituted by a portion of the protective resistor 3 at the side of the external connection terminal 1. The resistor 68 is connected to the current distribution resistors 76 to 83 constituted by dividing the protective resistor 3. In addition, the current distribution resistors 76 to 83 are connected to MOS transistor pairs 84 to 91. The external connection terminal 1 is driven by applying a signal to gate electrodes of the MOS transistor pairs 84 to 91.

Next, effects obtained by constituting the resistor 68 and the current distribution resistors 76 to 83 in the protective resistor 3 will be described.

A current of the protective resistor 3 that flows due to a surge voltage applied to the external connection terminal 1 tends to flow linearly from the external connection terminal 1 to the MOS transistor pairs 84 to 91. Particularly, this tendency is large in the vicinity of the external connection terminal 1. As a result, when distances between the external connection terminal 1 and slits 4 to 10 are short as in the first embodiment, the current due to the surge voltage tends to concentrate on protective resistors 14 and 15. In order to reduce this tendency, there is also a method of increasing a distance between the external connection terminal 1 and the protective resistor 3. However, in this case, a wiring layer 2 is lengthened and a current capacity of the wiring layer 2 is reduced. Further, a chip size increases.

Therefore, in the present embodiment, the slits 69 to are shorter than the protective resistor 3. In the present embodiment, the slits extend only to the center of the protective resistor 3, so that the resistor 68 is further disposed in the protective resistor 3. By disposing the resistor 68, it is possible to secure the distances from the external connection terminal 1 to the current distribution resistors 76 to 83 without changing a size of the protective resistor 3 or the wiring layer 2. By effects of a resistance increase due to reactance and heat generation, the current flowing through the resistor 68 can be uniformized and the current can flow uniformly to the current distribution resistors 76 to 83. As a result, a surge current can flow uniformly to the protective resistor 3. Although the center has been described as an example, the present invention is not limited to this. That is, the slits extend to the middle of the protective resistor 3, so that the resistor 68 can be further disposed.

By shortening the slits 69 to 75, the resistance values of the current distribution resistors 76 to 83 decrease. However, in order to prevent a wiring line from being damaged, a current capacity of the wiring line may be larger than a current value determined by a maximum value of the surge voltage and resistance values of the current distribution resistors 76 to 83, and this condition can be sufficiently satisfied even if the slits 69 to 75 are shortened. This effect can be maximally obtained when the slits 69 to 75 are disposed to extend from the connection end side with the MOS transistor pairs 84 to 91. This is because, if the slits 69 to 75 are slightly separated from the connection end side with the MOS transistor pairs 84 to 91, a resistance component is generated in a separated gap and the substantial resistance values of the current distribution resistors 76 to 83 are reduced due to an influence of the resistance component.

Figure 16:
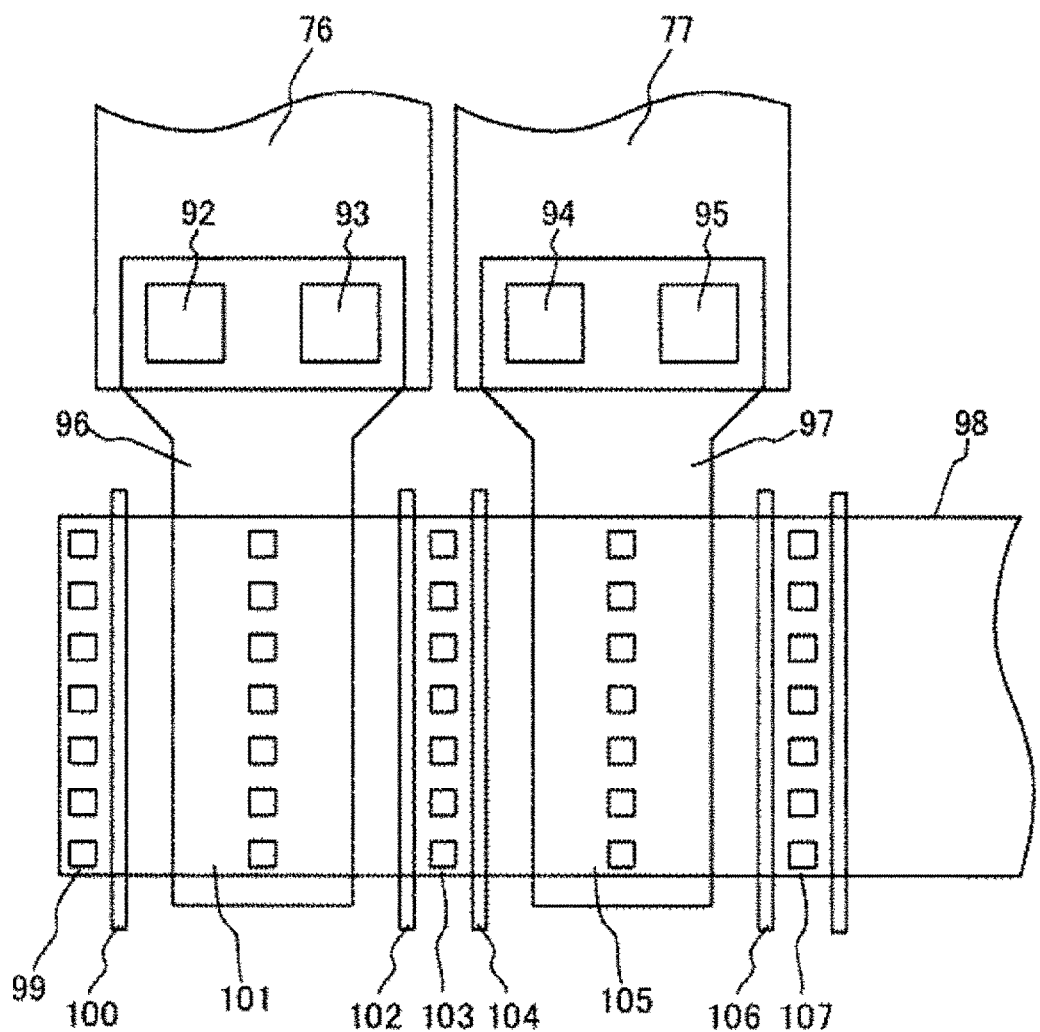
FIG. 16 is an enlarged view of a C portion of FIG. 15.
Figure 18:
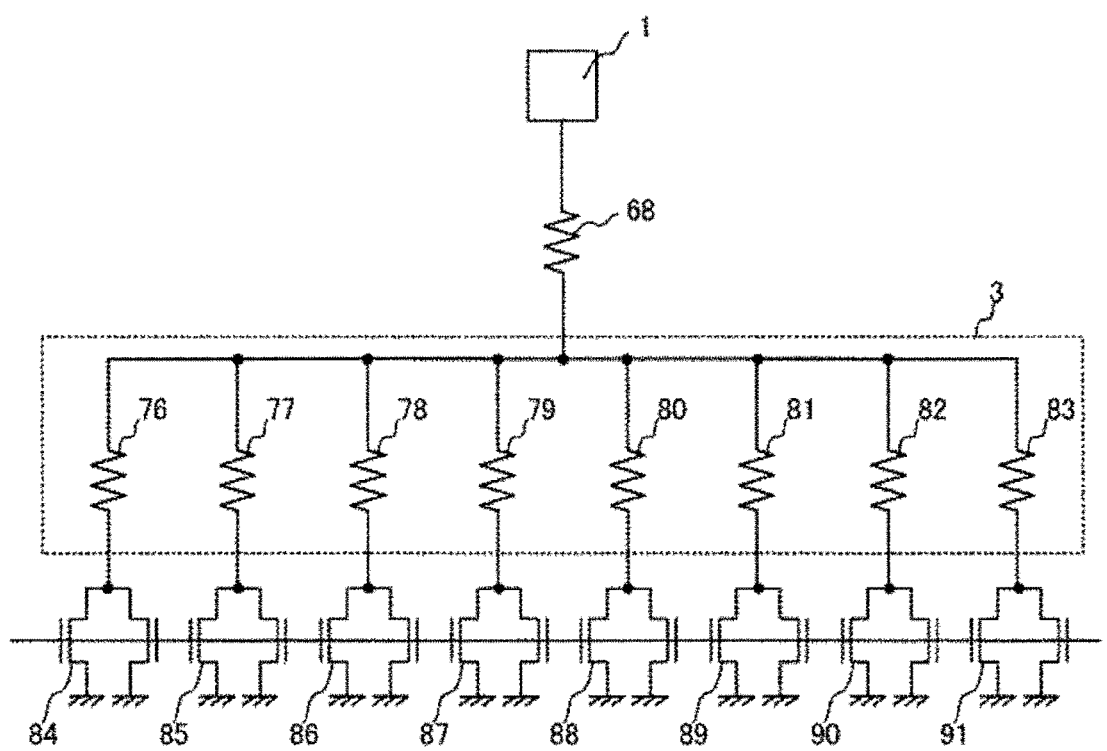
FIG. 18 is a circuit diagram of a protective circuit of an electronic device according to a fifth embodiment.

Further, in the present embodiment, as shown in FIG. 16 or FIG. 18, the MOS transistors 19 to 26 are replaced by the MOS transistor pairs 84 to 91.

The details of the MOS transistor pairs 84 and 85 will be described using FIG. 16. Also, the MOS transistor pairs 86 to 91 have the same configuration as that of the MOS transistor pairs 84 and 85.

The MOS transistor pair 84 constitutes sources 99 and 103 and a drain 101 by disposing gate electrodes 100 and 102 in a diffusion layer 98. The sources 99 and 103 are connected to a ground. The drain 101 is connected to the current distribution resistor 76 via a wiring layer 96 and contacts 92 and 93.

The MOS transistor pair 85 constitutes sources 103 and 107 and a drain 105 by disposing gate electrodes 104 and 106 in the diffusion layer 98. The sources 103 and 107 are connected to a ground. The drain 105 is connected to the current distribution resistor 77 via a wiring layer 97 and contacts 94 and 95.

Effects of the MOS transistor pairs will be described.

By sharing a source region or a drain region of the adjacent MOS transistors, the chip size can be reduced. Further, since a diffusion layer does not need to be provided individually in each MOS transistor and a plurality of MOS transistors can be disposed in one diffusion layer 98, the chip size can be reduced. Like the present embodiment, even if the two MOS transistors are connected to each of the current distribution resistors 76 to 83, a maximum value of a surge current is determined by a maximum value of the surge voltage and resistance values of the current distribution resistors 76 to 83. That is, even if a plurality of MOS transistors are connected to each of the current distribution resistors 76 to 83, the maximum value of the surge current hardly changes, so that the wiring line can be prevented from being damaged.

Improvement Example of Slit Shape

Figure 17:
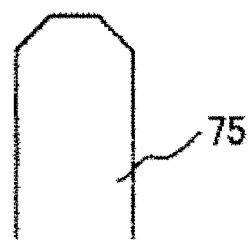
FIG. 17 is an enlarged view of a D portion of FIG. 15.

Next, an improvement example of a tip shape of the slit 75 described in the first to fifth embodiments will be described using FIG. 17. A tip of the slit 75 has a shape in which corners are rounded off as shown in FIG. 17. By rounding the tip shape of the slit in this manner, a surge application current flowing due to the surge application flows smoothly and heat generation in a tip portion can be suppressed.

Sixth Embodiment

Figure 19:
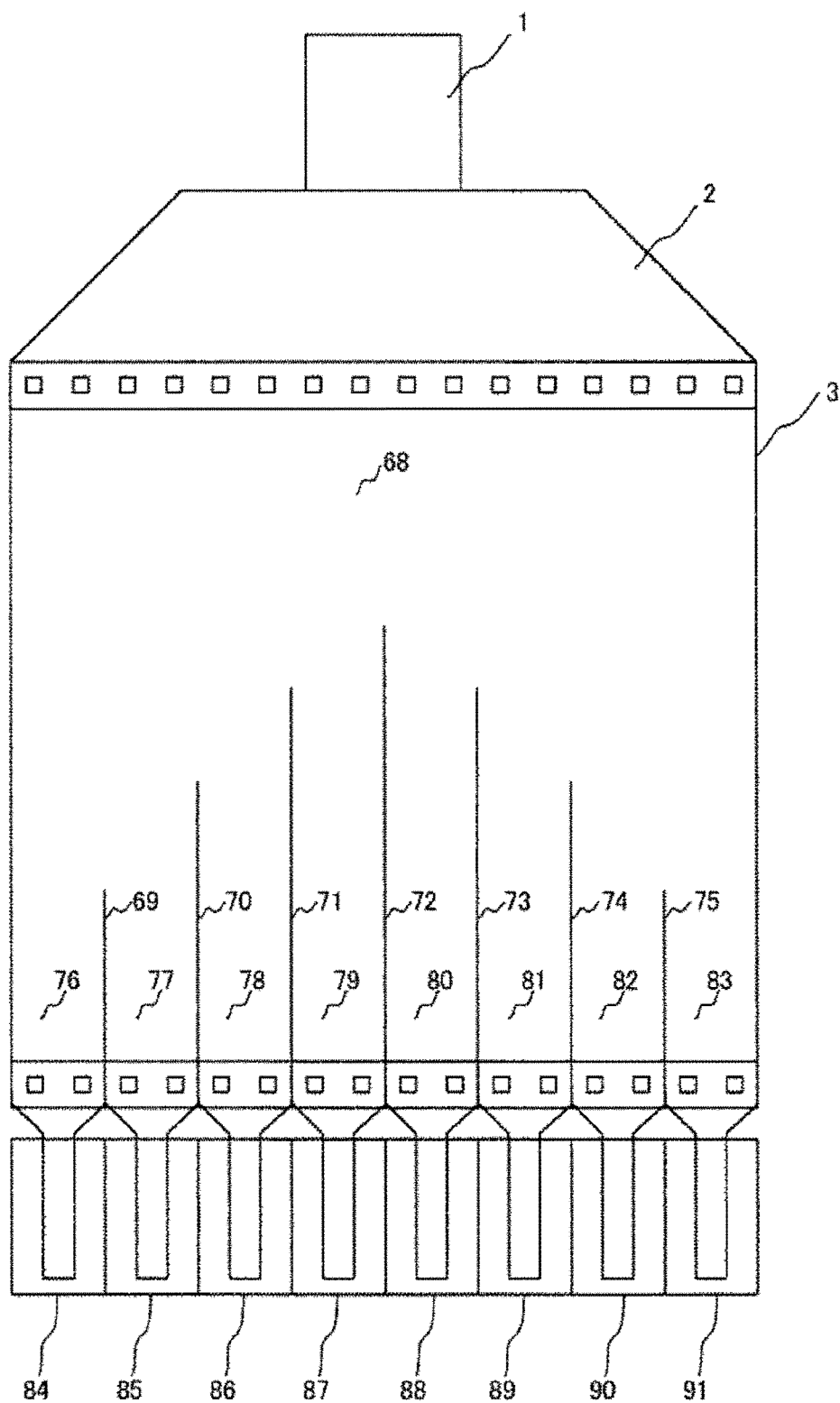
FIG. 19 shows a configuration of a protective circuit of an electronic device according to a sixth embodiment.

Next, an electronic device to be a sixth embodiment of the present invention will be described using FIG. 19. FIG. 19 shows a configuration of a protective circuit of the electronic device according to the sixth embodiment. Description of the same configuration as that of the fifth embodiment will be omitted.

The protective circuit of the electronic device according to the present embodiment is basically the same as that of the electronic device according to the fifth embodiment. However, slits 69 and 75 on the side end side of a protective resistor 3 are shortened and slits 71, 72, and 73 in a center portion of the protective resistor 3 are lengthened. In other words, the slits on the side end side are shorter than the slits on the center side. In this way, resistance values of current distribution resistors on the side end side decrease and a surge current is more likely to flow to the side ends of the protective resistor 3. When an external connection terminal 1 is located at the center side, the surge current tends to flow linearly, so that the current tends to be hard to flow to the side end side. According to the present embodiment, since the resistance of the current distribution resistors far from the external connection terminal 1 (on the side end side) decreases, the surge current can flow through the protective resistor 3 more uniformly.

Seventh Embodiment

Figure 20:
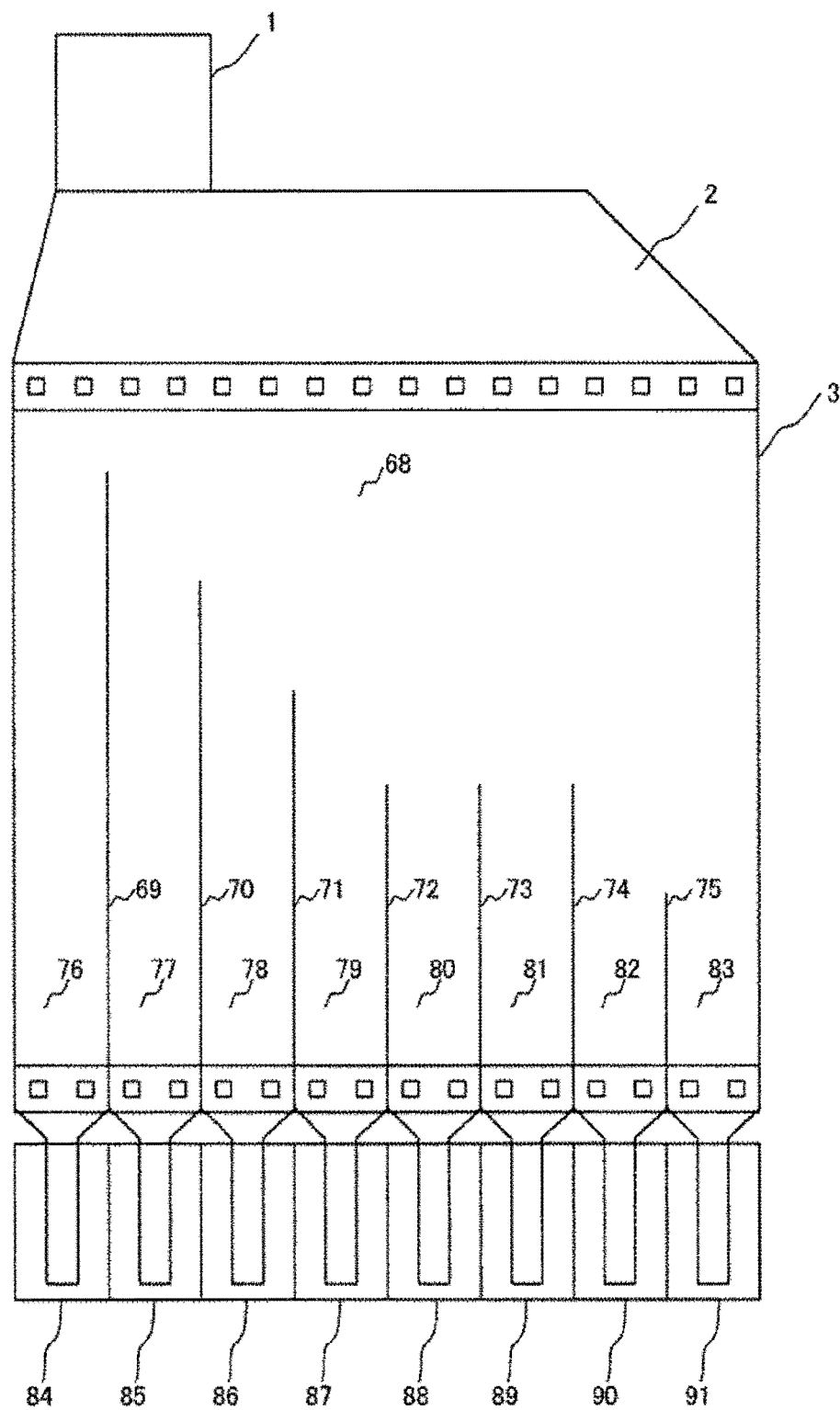
FIG. 20 shows a configuration of a protective circuit of an electronic device according to a seventh embodiment.

Next, an electronic device to be a seventh embodiment of the present invention will be described using FIG. 20. FIG. 20 shows a configuration of a protective circuit of the electronic device according to the seventh embodiment. Description of the same configuration as those of the fifth and sixth embodiments will be omitted.

The protective circuit of the electronic device according to the present embodiment is basically the same as that of the electronic device according to the fifth embodiment. However, an external connection terminal 1 is configured to be biased to the left side. Further, a slit 75 of a side end of a protective resistor 3 is shortened and slits 69, 70, and 71 close to the external connection terminal 1 are lengthened. In this way, a surge current is more likely to flow to the right side of the protective resistor 3. According to the present embodiment, since the resistance of a current distribution resistor far from the external connection terminal 1 (on the right end side) decreases, the surge current can flow through the protective resistor 3 more uniformly. As a result, even if the external connection terminal 1 is biased to the left side, the surge current can flow through the protective resistor 3 more uniformly. The same is applicable to the case where the external terminal 1 is provided on the right side.

Eighth Embodiment

Figure 21:
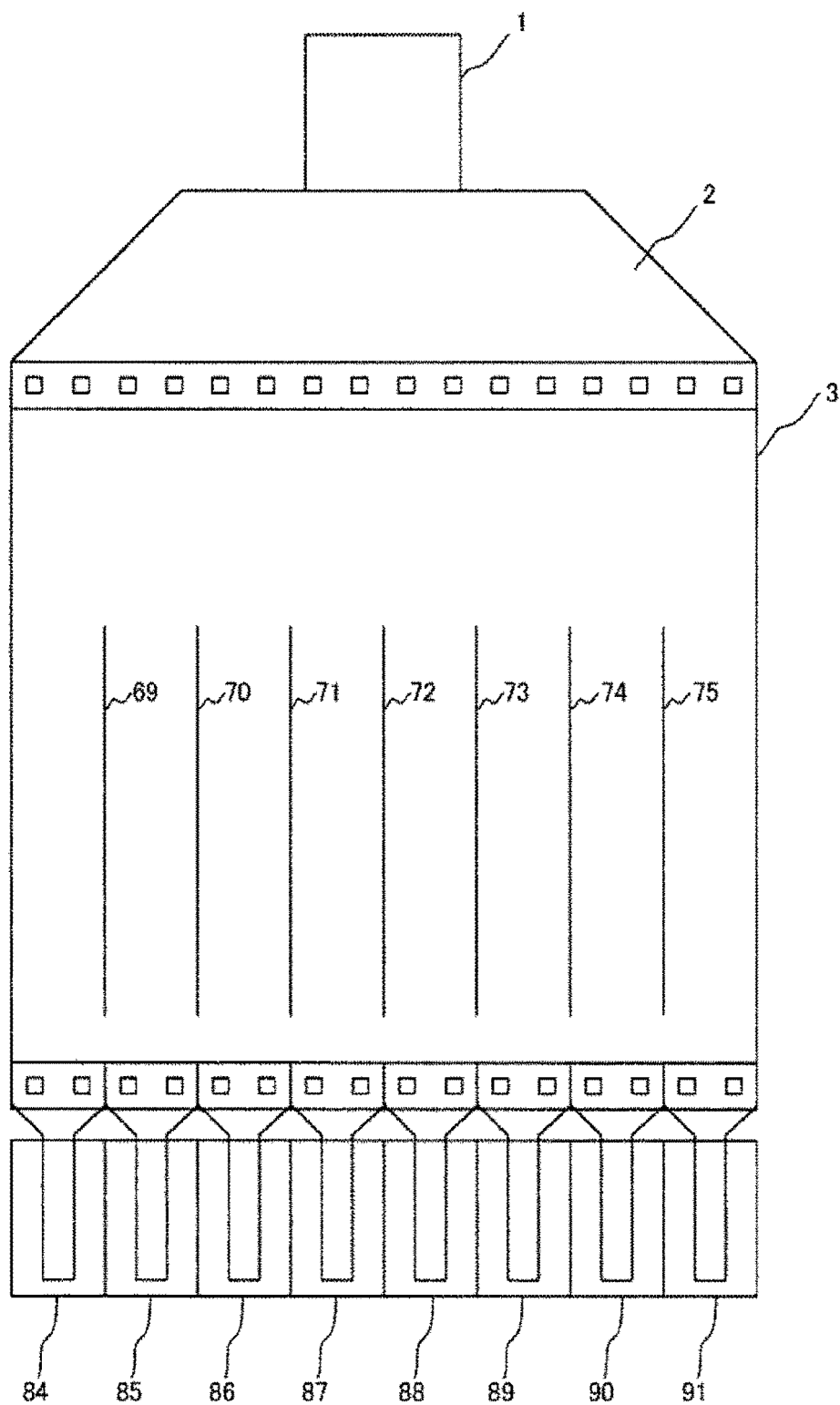
FIG. 21 shows a configuration of a protective circuit of an electronic device according to an eighth embodiment.

Next, an electronic device to be an eighth embodiment of the present invention will be described using FIG. 21. Description of the same configuration as that of the fifth embodiment will be omitted.

A protective circuit of the electronic device according to the present embodiment is basically the same as that of the electronic device according to the fifth embodiment. However, slits 69 to 75 are separated from a connection end with MOS transistor pairs 84 to 91. Even in this case, an equivalent circuit of the protective circuit is the same as the circuit diagram of FIG. 18 shown in the fifth embodiment. That is, similarly to the fifth embodiment, a surge current flowing when a surge voltage is applied can flow through a protective resistor 3 more uniformly and a connection wiring line to the MOS transistor pairs 84 to 91 can be prevented from being damaged by the surge current flowing when the surge voltage is applied.

Ninth Embodiment

Figure 22:
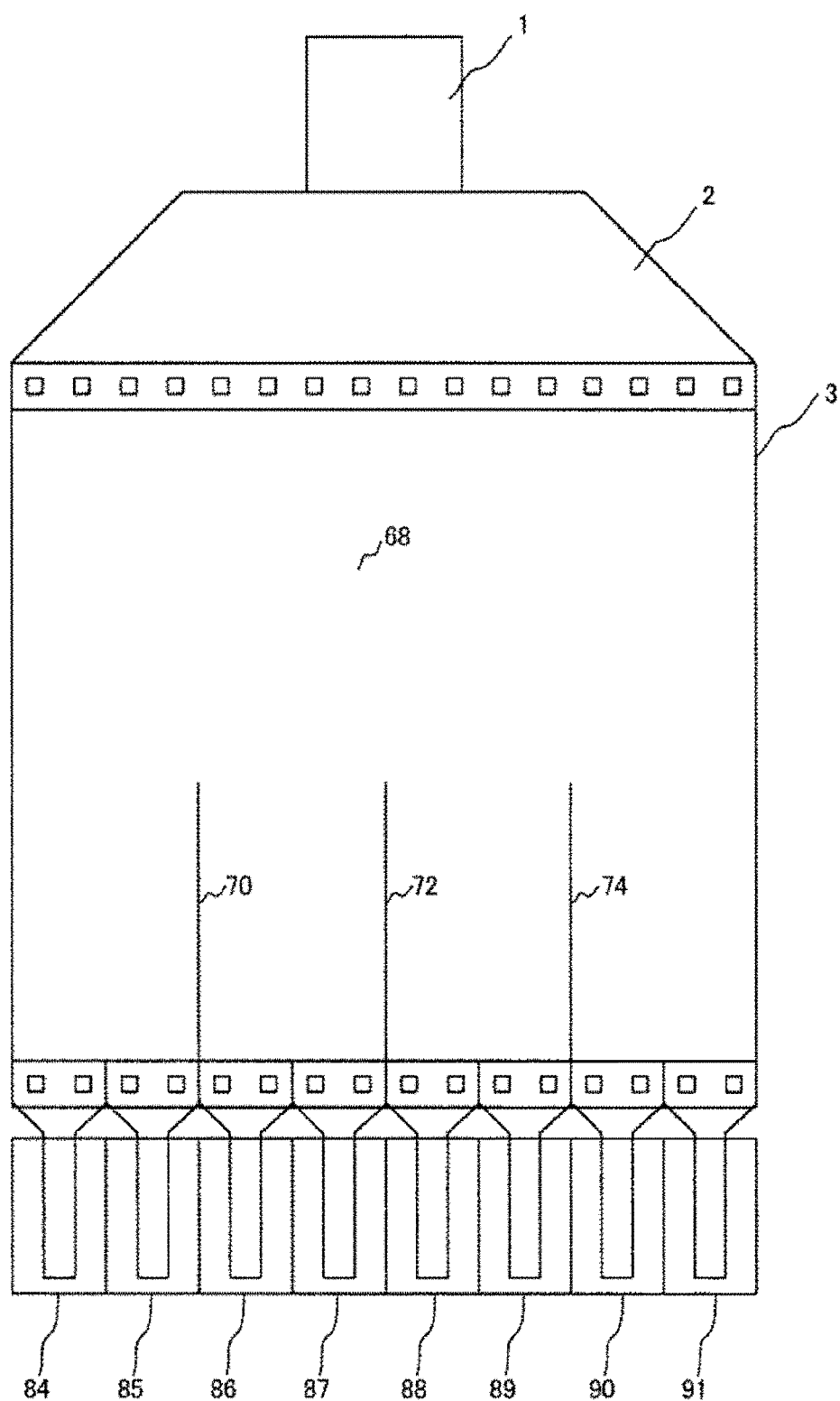
FIG. 22 shows a configuration of a protective circuit of an electronic device according to a ninth embodiment.

Next, an electronic device to be a ninth embodiment of the present invention will be described using FIG. 22. Description of the same configuration as that of the fifth embodiment will be omitted.

A protective circuit of the electronic device according to the present embodiment is basically the same as that of the electronic device according to the fifth embodiment. However, slits 69, 71, 73, and 75 are removed to reduce the number of slits. Even in this case, a current flowing to MOS transistor pairs 84 to 91 when a surge voltage is applied can be limited. As a result, a connection wiring line to the MOS transistor pairs 84 to 91 can be prevented from being damaged by a surge current flowing when the surge voltage is applied. That is, a protective resistor is divided into a connection place of the MOS transistor pairs 84 and 85, a connection place of the MOS transistor pairs 86 and 87, a connection place of the MOS transistor pairs 88 and 89, and a connection place of the MOS transistor pairs 90 and 91 by slits 70, 72, and 74, so that it is possible to limit the current flowing to the MOS transistor pairs 84 to 91 when the surge voltage is applied. In other words, a protective resistor 3 is divided by the slits 70, 72, and 74 to constitute a plurality of current distribution resistors and the current distribution resistors are connected to the MOS transistor pairs 84 and 85, the MOS transistor pairs 86 and 87, the MOS transistor pairs 88 and 89, and the MOS transistor pairs 90 and 91. In this way, it is possible to limit the current flowing to the MOS transistor pairs 84 to 91 when the surge voltage is applied. As a result, the connection wiring line to the MOS transistor pairs 84 to 91 can be prevented from being damaged by the surge current flowing when the surge voltage is applied.

Tenth Embodiment

Figure 23:
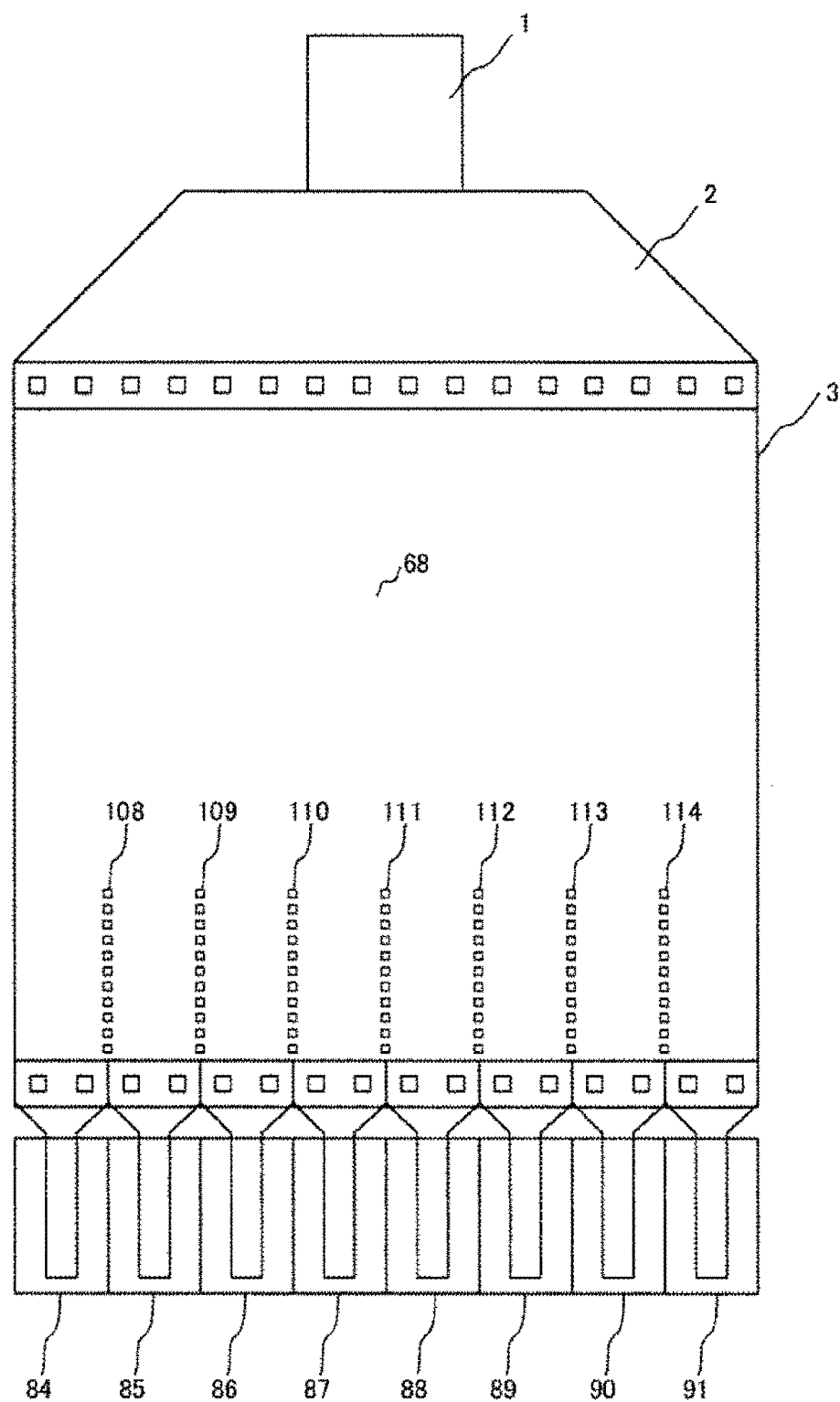
FIG. 23 shows a configuration of a protective circuit of an electronic device according to a tenth embodiment.

Next, an electronic device to be a tenth embodiment of the present invention will be described using FIG. 23. Description of the same configuration as that of the fifth embodiment will be omitted.

A protective circuit of the electronic device according to the present embodiment is basically the same as that of the electronic device according to the fifth embodiment. However, slits 69 to 75 are replaced by continuous hole rows 108 to 114. Even in this case, an equivalent circuit of the protective circuit is the same as the circuit diagram of FIG. 18 shown in the fifth embodiment.

Eleventh Embodiment

Figure 24:
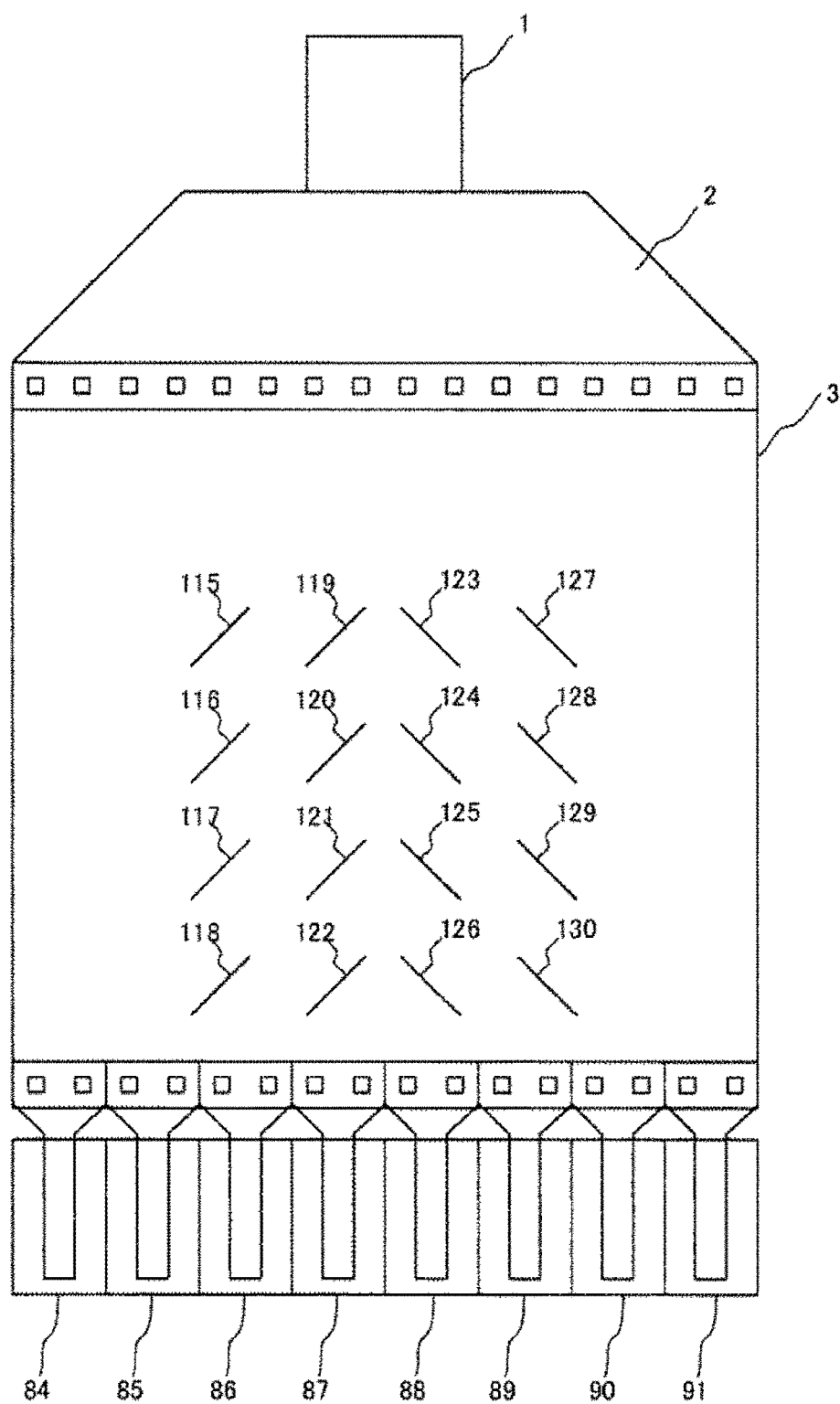
FIG. 24 shows a configuration of a protective circuit of an electronic device according to an eleventh embodiment.

Next, an electronic device to be an eleventh embodiment of the present invention will be described using FIG. 24. Description of the same configuration as that of the fifth embodiment will be omitted.

A protective circuit of the electronic device according to the present embodiment is basically the same as that of the electronic device according to the fifth embodiment. However, slits 69 to 75 are replaced by slits 115 to 130 disposed in an oblique direction. Even in this case, an equivalent circuit of the protective circuit is the same as the circuit diagram of FIG. 18 shown in the fifth embodiment.

Twelfth Embodiment

Figure 25:
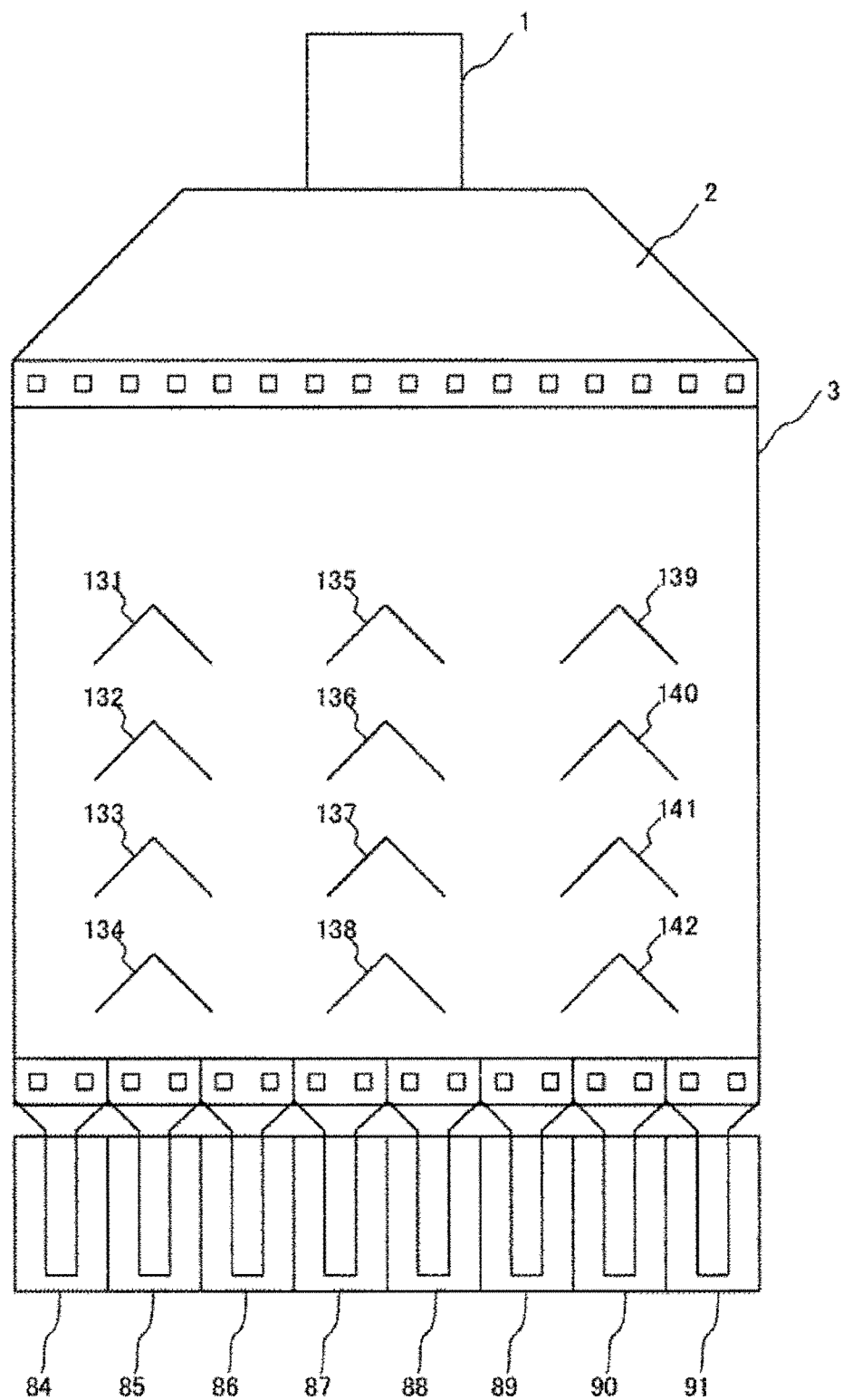
FIG. 25 shows a configuration of a protective circuit of an electronic device according to a twelfth embodiment.

Next, an electronic device to be a twelfth embodiment of the present invention will be described using FIG. 25. Description of the same configuration as that of the eleventh embodiment will be omitted.

A protective circuit of the electronic device according to the present embodiment is basically the same as that of the electronic device according to the eleventh embodiment. However, slits 115 to 130 are replaced by chevron slits 131 to 142. Even in this case, an equivalent circuit of the protective circuit is the same as the circuit diagram of FIG. 18 shown in the fifth embodiment.

Thirteenth Embodiment

Figure 26:
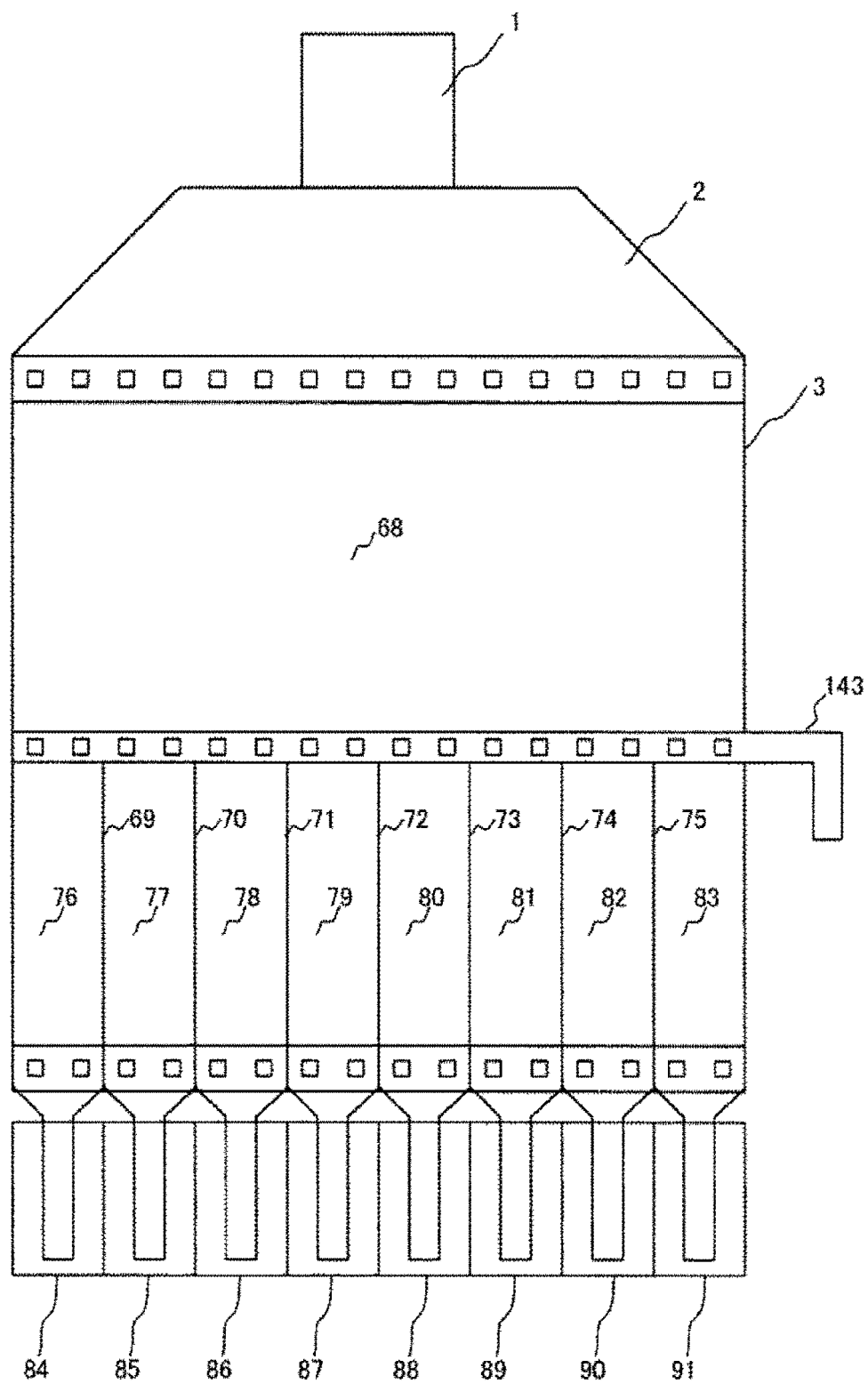
FIG. 26 shows a configuration of a protective circuit of an electronic device according to a thirteenth embodiment.
Figure 27:
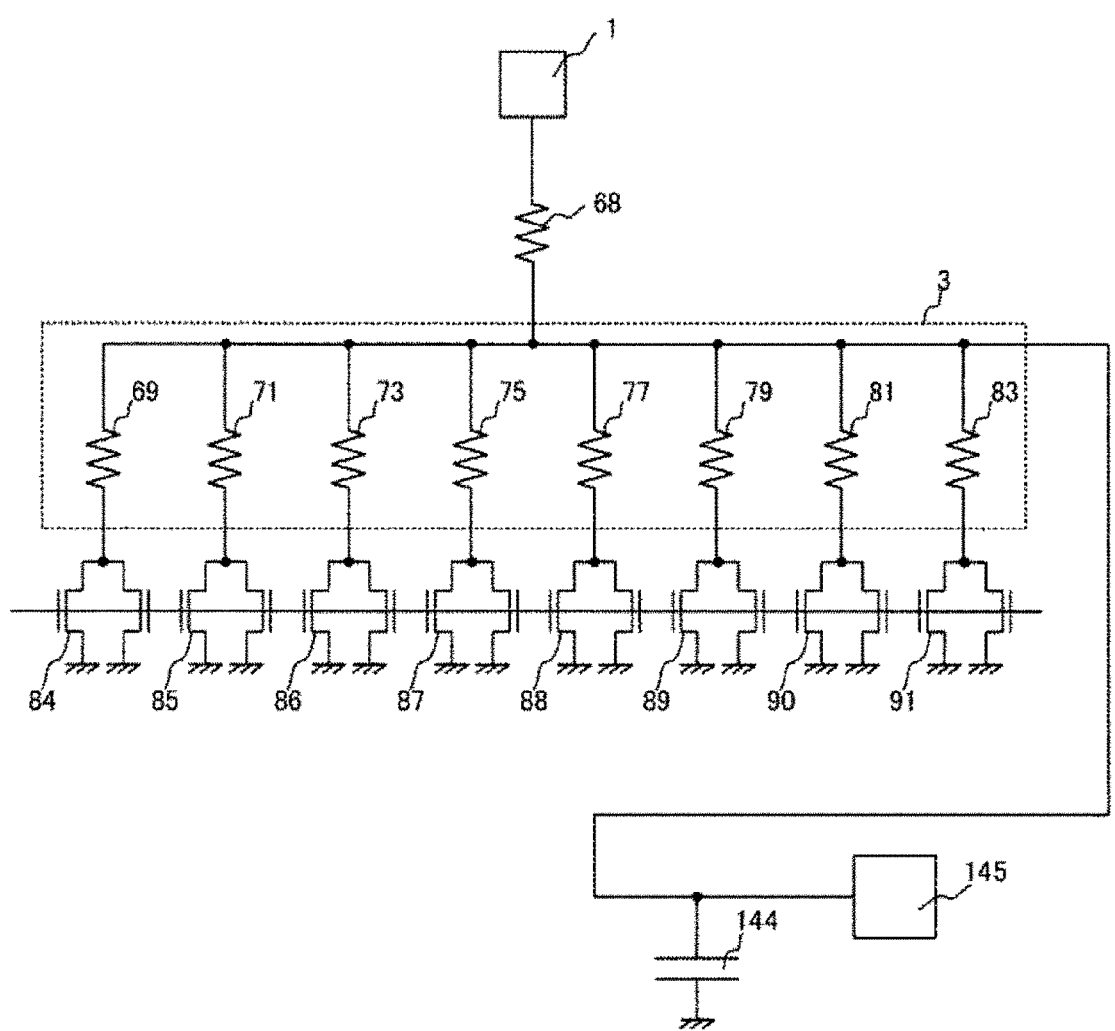
FIG. 27 is a circuit diagram of a protective circuit of an electronic device according to a thirteenth embodiment.

Next, an electronic device to be a thirteenth embodiment of the present invention will be described using FIGS. 26 and 27. Description of the same configuration as that of the fifth embodiment will be omitted.

A protective circuit of the electronic device according to the present embodiment is basically the same as that of the electronic device according to the fifth embodiment. However, a wiring layer 143 is added and a capacitor 144 is disposed and is connected to an internal circuit 145 such as an AD converter.

In the present embodiment, a filter can be constituted by a resistor 68 and the capacitor 144. By disposing the filter, a surge voltage or a radio frequency noise input from an external connection terminal 1 can be attenuated by the filter and the internal circuit 145 can be stabilized. That is, in the present embodiment, a chip size can be reduced by sharing the resistor 68 as a resistor used for surge voltage protection and filter function achievement.

As described above, a protective resistor 3 is insulated from a silicon substrate 29 by an oxide film 28. As a result, insulation is secured against surges of a positive potential and a negative potential applied to the external connection terminal 1. Therefore, the filter of the present embodiment maintains an average value even if a voltage equal to or higher than a power supply voltage or equal to or lower than a ground voltage is input to the external connection terminal 1. That is, even if a high voltage such as the surge is applied to the external connection terminal 1, the filter of the present embodiment can operate normally.

When a signal is taken from the wiring layer 143 to the internal circuit 145, the resistor 68 is connected in series between the external connection terminal 1 and the internal circuit 145 and series circuits of current distribution resistors 76 to 83 and MOS transistor pairs 84 to 91 are connected in parallel to the ground. Therefore, a signal of the wiring layer 143, that is, a signal input to the internal circuit 145 is protected by a surge protective circuit constituted by the resistor 68, the current distribution resistors 76 to 83, and the MOS transistor pairs 84 to 91. Particularly, by inserting the resistor 68, a higher surge voltage attenuation effect can be obtained, and the internal circuit 145 which is weak to the surge voltage can be protected more strongly. As a result, it is possible to prevent breakdown or malfunction of the internal circuit 145 due to the surge voltage, so that a more reliable electronic device can be provided.

Fourteenth Embodiment

Figure 28:
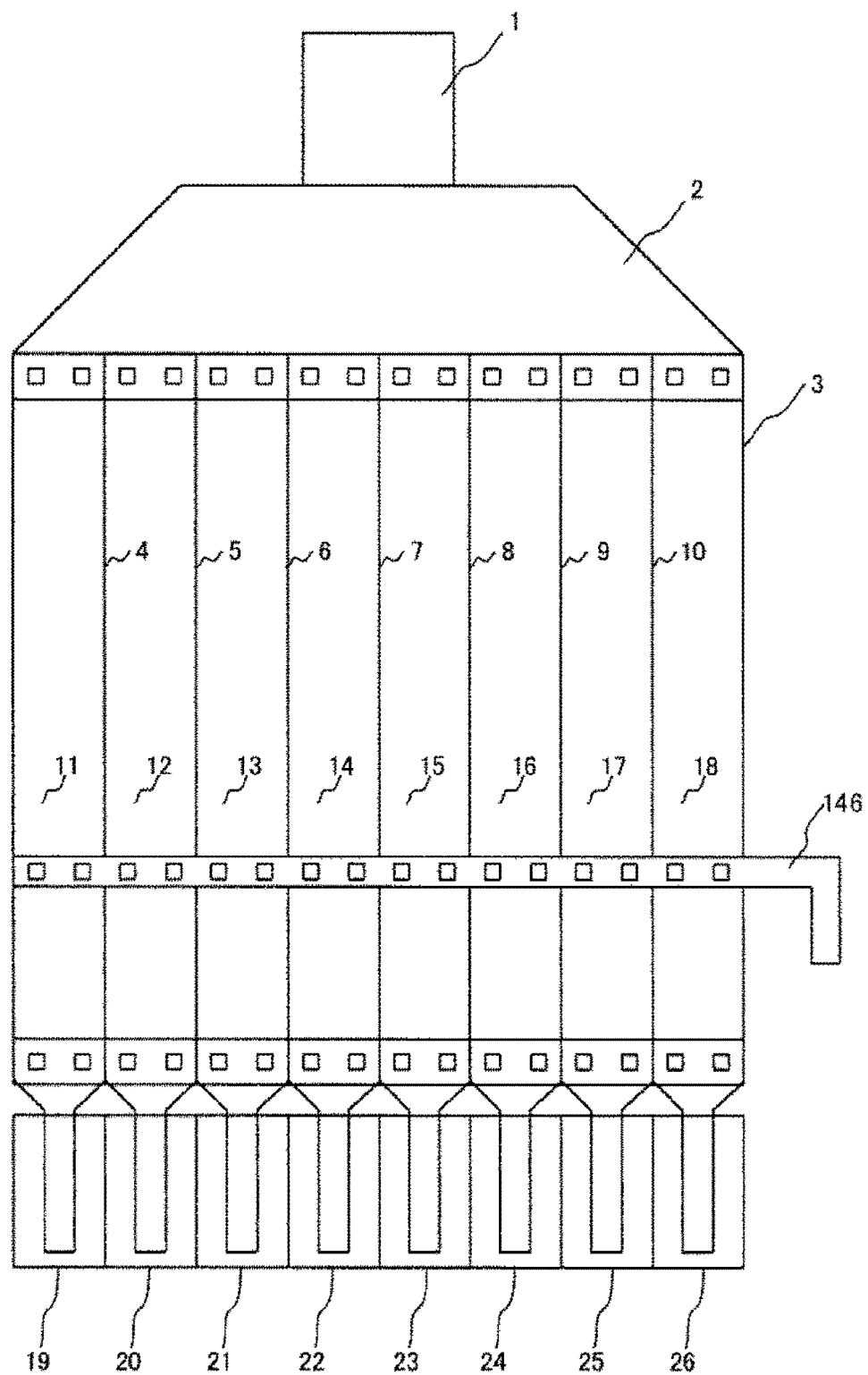
FIG. 28 shows a configuration of a protective circuit of an electronic device according to a fourteenth embodiment.

Next, an electronic device to be a fourteenth embodiment of the present invention will be described using FIG. 28. FIG. 28 shows a configuration of a protective circuit of the electronic device according to the fourteenth embodiment.

The protective circuit of the electronic device according to the present embodiment is basically the same as that of the electronic device according to the first embodiment. However, a wiring layer 145 is added. Since an equivalent circuit of the protective circuit is basically the same as the circuit diagram of FIG. 27 shown in the thirteenth embodiment, similarly to the thirteenth embodiment, a surge current flowing when a surge voltage is applied can flow through a protective resistor 3 more uniformly and a connection wiring line to MOS transistors 19 to 26 can be prevented from being damaged by the surge current flowing when the surge voltage is applied. Further, since the resistor 68 can be equivalently realized by adding the wiring layer 146, a filter can be constituted by connecting a capacitor 144. By disposing the filter, a surge voltage or a radio frequency noise input from an external connection terminal 1 can be attenuated by the filter. As a result, it is possible to prevent breakdown or malfunction of the internal circuit 145 due to the surge voltage, so that a more reliable electronic device can be provided.

In the embodiments described above, the slits have been described as an example of the pattern portions formed in the protective resistor. However, the same effects can be achieved even if grooves are used. Similarly, the continuous holes have been described as an example of the pattern portions formed in the protective resistor. However, the same effects can be achieved even if continuous recesses are used. Further, these pattern portions are not limited to the configuration where the pattern portions are formed by etching or the like after film formation, and the present invention naturally include other configuration where the pattern portions are formed at the time of film formation by masking.

REFERENCE SIGNS LIST 1 external connection terminal
2 wiring layer
3 protective resistor
4 slit
5 slit
6 slit
7 slit
8 slit
9 slit
10 slit
11 current distribution resistor
12 current distribution resistor
13 current distribution resistor
14 current distribution resistor
15 current distribution resistor
16 current distribution resistor
17 current distribution resistor
18 current distribution resistor
19 MOS transistor
20 MOS transistor
21 MOS transistor
22 MOS transistor
23 MOS transistor
24 MOS transistor
25 MOS transistor
26 MOS transistor
27 contact
28 oxide film
29 silicon substrate
30 contact
31 contact
32 contact
33 contact
34 wiring layer
35 wiring layer
36 diffusion layer
37 source
38 gate electrode
39 drain
40 source
41 gate electrode
42 drain
43 diffusion layer
44 MOS diode
45 MOS diode
46 MOS diode
47 MOS diode
48 MOS diode
49 MOS diode
50 MOS diode
51 MOS diode
52 bipolar transistor
53 bipolar transistor
54 bipolar transistor
55 bipolar transistor
56 bipolar transistor
57 bipolar transistor
58 bipolar transistor
59 bipolar transistor
60 diode
61 diode
62 diode
63 diode
64 diode
65 diode
66 diode
67 diode
68 resistor
69 slit
70 slit
71 slit
72 slit
73 slit
74 slit
75 slit
76 current distribution resistor
77 current distribution resistor
78 current distribution resistor
79 current distribution resistor
80 current distribution resistor
81 current distribution resistor
82 current distribution resistor
83 current distribution resistor
84 MOS transistor pair
85 MOS transistor pair
86 MOS transistor pair
87 MOS transistor pair
88 MOS transistor pair
89 MOS transistor pair
90 MOS transistor pair
91 MOS transistor pair
92 contact
93 contact
94 contact
95 contact
96 wiring layer
97 wiring layer
98 diffusion layer
99 source
100 gate electrode
101 drain
102 gate electrode
103 source
104 gate electrode
105 drain
106 gate electrode
107 source 108 continuous hole rows
109 continuous hole rows
110 continuous hole rows
111 continuous hole rows
112 continuous hole rows
113 continuous hole rows
114 continuous hole rows
115 slit
116 slit
117 slit
118 slit
119 slit
120 slit
121 slit
122 slit
123 slit
124 slit
125 slit
126 slit
127 slit
128 slit
129 slit
130 slit
131 slit
132 slit
133 slit
134 slit
135 slit
136 slit
137 slit
138 slit
139 slit
140 slit
141 slit
142 slit
143 wiring layer
144 capacitor
145 internal circuit
146 wiring layer

The invention claimed is:

1. An electronic device having a semiconductor device which includes an external connection terminal, a protective resistor connected to the external connection terminal, and a plurality of semiconductor elements connected to the protective resistor and the plurality of semiconductor elements being connected in parallel,
wherein the protective resistor has a pattern portion which is formed of at least one of a slit, a groove, a continuous hole, or a continuous recess,
wherein the pattern portion is provided along an energization direction of a current flowing to the protective resistor, and
wherein the pattern portion is formed to extend from a connection end side of the protective resistor with the plurality of semiconductor elements.

2. The electronic device according to claim 1, wherein the pattern portion is formed to extend to a middle of the protective resistor.

3. The electronic device according to claim 2, wherein a plurality of current distribution resistors are constituted by dividing the protective resistor by a plurality of slits, a plurality of grooves, a plurality of continuous holes, or a plurality of continuous recesses, and the plurality of current distribution resistors are connected to the plurality of semiconductor elements.

4. The electronic device according to claim 3, wherein an electric connection portion is provided on the current distribution resistors.

5. The electronic device according to claim 4, wherein an electric signal is extracted from the electric connection portion and an electric signal to an internal circuit is extracted.

6. The electronic device according to claim 4, wherein an electric signal is extracted from the electric connection portion and is connected to a capacitor.

7. The electronic device according to claim 1, wherein the pattern portion has at least one of a plurality of slits, a plurality of grooves, a plurality of continuous holes, or a plurality of continuous recesses.

8. The electronic device according to claim 7, wherein the pattern portion is formed to be shorter on a side closer to a side end of the protective resistor.

9. The electronic device according to claim 7, wherein the pattern portion has at least one of the plurality of slits, the plurality of grooves, the plurality of continuous holes, or the plurality of continuous recesses disposed to divide a connection place of the plurality of semiconductor elements and the protective resistor into a plurality of parts.

10. The electronic device according to claim 1, wherein the plurality of semiconductor elements are semiconductor elements having breakdown characteristics.

11. An electronic device having a semiconductor device which includes an external connection terminal, a protective resistor connected to the external connection terminal, and a plurality of semiconductor elements connected to the protective resistor and the plurality of semiconductor elements being connected in parallel,
wherein the protective resistor has a pattern portion which is formed of at least one of a slit, a groove, a continuous hole, or a continuous recess,
wherein the pattern portion has at least one of a plurality of slits, a plurality of grooves, a plurality of continuous holes, or a plurality of continuous recesses,
wherein the pattern portion is formed to be longer on a side of the protective resistor closer to the external connection terminal.

12. An electronic device having a semiconductor device which includes an external connection terminal, a protective resistor connected to the external connection terminal, and a plurality of semiconductor elements connected to the protective resistor and the plurality of semiconductor elements being connected in parallel,
wherein the protective resistor has a pattern portion which is formed of at least one of a slit, a groove, a continuous hole, or a continuous recess,
wherein the pattern portion has at least one of a plurality of slits, a plurality of grooves, a plurality of continuous holes, or a plurality of continuous recesses,
wherein the slits have a shape in which corners of ends are rounded off.

* * * * *